US009876165B2

(12) United States Patent
Kim et al.

(10) Patent No.: US 9,876,165 B2
(45) Date of Patent: Jan. 23, 2018

(54) METHOD FOR FORMING PATTERNS AND METHOD FOR MANUFACTURING MAGNETIC MEMORY DEVICE USING THE SAME

(71) Applicant: SAMSUNG ELECTRONICS CO., LTD., Suwon-si, Gyeonggi-do (KR)

(72) Inventors: Sang-Kuk Kim, Seongnam-si (KR); Jong-Kyu Kim, Seongnam-si (KR); Jongchul Park, Seongnam-si (KR); Inho Kim, Suwon-si (KR); Gwang-Hyun Baek, Seoul (KR); Jung-Ik Oh, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/180,843

(22) Filed: Jun. 13, 2016

(65) Prior Publication Data

US 2017/0062709 A1 Mar. 2, 2017

(30) Foreign Application Priority Data

Sep. 2, 2015 (KR) .......................... 10-2015-0124267

(51) Int. Cl.
| H01L 43/12 | (2006.01) |
| H01L 43/08 | (2006.01) |
| H01L 43/02 | (2006.01) |
| H01L 43/10 | (2006.01) |

(52) U.S. Cl.
CPC .............. *H01L 43/12* (2013.01); *H01L 43/02* (2013.01); *H01L 43/08* (2013.01); *H01L 43/10* (2013.01)

(58) Field of Classification Search
CPC ......... H01L 43/12; H01L 43/08; H01L 43/10; H01L 43/02; G11C 11/161
See application file for complete search history.

(56) References Cited

U.S. PATENT DOCUMENTS

| 7,015,524 | B2 | 3/2006 | Ikeda |
| 7,936,027 | B2 | 5/2011 | Xiao et al. |
| 8,574,928 | B2 | 11/2013 | Satoh et al. |
| 8,796,042 | B2 | 8/2014 | Shin et al. |
| 8,941,195 | B2 | 1/2015 | Lee et al. |
| 8,975,089 | B1 | 3/2015 | Jung et al. |
| 9,070,869 | B2 | 6/2015 | Jung et al. |
| 9,087,981 | B2 | 7/2015 | Hsu et al. |
| 9,166,154 | B2 | 10/2015 | Satoh et al. |
| 9,190,608 | B2 | 11/2015 | Lee et al. |

(Continued)

FOREIGN PATENT DOCUMENTS

| KR | 10-2003-0002142 A | 1/2003 |
| KR | 10-2010-0076557 A | 7/2010 |

(Continued)

*Primary Examiner* — Michael Carter
*Assistant Examiner* — Mohammed R Alam
(74) *Attorney, Agent, or Firm* — Lee & Morse, P.C.

(57) ABSTRACT

A method for forming a pattern, the method including forming an etch target layer on a substrate; patterning the etch target layer to form patterns; and performing a pre-oxidation trim process a plurality of times, the pre-oxidation trim process including performing an oxidation process to form an insulating layer on a sidewall of each of the patterns; and performing a sputter etch process to remove at least a portion of the insulating layer.

20 Claims, 35 Drawing Sheets

(56) References Cited

U.S. PATENT DOCUMENTS

| | | | |
|---|---|---|---|
| 9,246,082 B2 | 1/2016 | Tokashiki | |
| 2011/0007422 A1* | 1/2011 | Nazarov | G11B 5/3106 |
| | | | 360/235.4 |
| 2012/0139115 A1* | 6/2012 | You | H01L 23/5384 |
| | | | 257/751 |
| 2015/0140787 A1* | 5/2015 | Zhang | H01L 21/30604 |
| | | | 438/478 |
| 2015/0270127 A1* | 9/2015 | Li | H01L 21/76205 |
| | | | 438/425 |
| 2015/0311432 A1 | 10/2015 | Nakagawa et al. | |
| 2016/0087195 A1* | 3/2016 | Sonoda | H01L 43/12 |
| | | | 438/3 |
| 2016/0380028 A1* | 12/2016 | Sonoda | H01L 43/02 |
| | | | 257/421 |

FOREIGN PATENT DOCUMENTS

| | | |
|---|---|---|
| KR | 10-2012-0086938 A | 8/2012 |
| KR | 10-2012-0108296 A | 10/2012 |
| KR | 10-2015-0053938 A | 5/2015 |

\* cited by examiner

METHOD FOR FORMING PATTERNS AND METHOD FOR MANUFACTURING MAGNETIC MEMORY DEVICE USING THE SAME

CROSS-REFERENCE TO RELATED APPLICATION

Korean Patent Application No. 10-2015-0124267, filed on Sep. 2, 2015, in the Korean Intellectual Property Office, and entitled: "Method for Forming Patterns and Method for Manufacturing Magnetic Memory Device Using the Same," is incorporated by reference herein in its entirety.

BACKGROUND

1. Field

Embodiments relate to a method for forming patterns and a method for manufacturing a magnetic memory device using the same.

2. Description of the Related Art

As high-speed and low power consumption electronic devices may be demanded, semiconductor memory devices that may be used therein may need to have fast read/write operation and low operating voltage characteristics. Magnetic memory devices may have, for example, high-speed and/or non-volatile characteristics.

SUMMARY

Embodiments may be realized by providing a method for forming a pattern, the method including forming an etch target layer on a substrate; patterning the etch target layer to form patterns; and performing a pre-oxidation trim process a plurality of times, the pre-oxidation trim process including performing an oxidation process to form an insulating layer on a sidewall of each of the patterns; and performing a sputter etch process to remove at least a portion of the insulating layer.

The sputter etch process may be performed in such a way that a portion of the insulating layer remains.

A remaining portion of the insulating layer may cover the sidewall of each of the patterns.

An etch by-product generated by the sputter etch process may be an insulating material.

An etch by-product generated by patterning the etch target layer may be re-deposited on the sidewall of each of the patterns to form a re-deposited layer, and at least a portion of the re-deposited layer may be oxidized to form the insulating layer.

At least a portion of the re-deposited layer may be removed whenever the pre-oxidation trim process is performed.

The pre-oxidation trim process may be repeatedly performed until the re-deposited layer is removed.

A portion of each of the patterns may be oxidized to form the insulating layer.

A width of each of the patterns may be reduced whenever the pre-oxidation trim process is performed.

The patterning of the etch target layer may include performing a first sputter etch process irradiating a first ion beam to the substrate, and the sputter etch process included in the pre-oxidation trim process may be a second sputter etch process irradiating a second ion beam to the substrate.

Incident energy of the second ion beam may be less than incident energy of the first ion beam.

An angle between the second ion beam and a top surface of the substrate may be smaller than an angle between the first ion beam and the top surface of the substrate.

The angle between the first ion beam and the top surface of the substrate may range from 60 degrees to 90 degrees, and the angle between the second ion beam and the top surface of the substrate may range from 30 degrees to 60 degrees.

A thickness of the insulating layer formed in each of the pre-oxidation trim processes performed the plurality of times may be in a range of 10 Å to 100 Å.

Embodiments may be realized by providing a method for manufacturing a magnetic memory device, the method including forming a magnetic tunnel junction layer on a substrate; patterning the magnetic tunnel junction layer to form magnetic tunnel junction patterns; and performing a pre-oxidation trim process a plurality of times, the pre-oxidation trim process including performing an oxidation process to form an insulating layer on a sidewall of each of the magnetic tunnel junction patterns; and performing a sputter etch process to remove at least a portion of the insulating layer.

An etch by-product generated by the sputter etch process may be an insulating material.

An etch by-product generated by patterning the magnetic tunnel junction layer may be re-deposited on the sidewall of each of the magnetic tunnel junction patterns to form a re-deposited layer, and at least a portion of the re-deposited layer may be oxidized to form the insulating layer.

At least a portion of the re-deposited layer may be removed whenever the pre-oxidation trim process is performed, and the pre-oxidation trim process may be repeatedly performed until the re-deposited layer is removed.

The forming of the magnetic tunnel junction layer may include sequentially depositing a first magnetic layer, a tunnel barrier layer, and a second magnetic layer, an intermixing layer may be formed on the sidewall of each of the magnetic tunnel junction patterns by patterning the magnetic tunnel junction layer, the intermixing layer may include materials that are included in the first magnetic layer, the tunnel barrier layer, and the second magnetic layer, respectively, and at least a portion of the intermixing layer may be oxidized to form the insulating layer.

At least a portion of the intermixing layer may be removed by the pre-oxidation trim process.

The pre-oxidation trim process may be repeatedly performed until the intermixing layer is removed.

A portion of each of the magnetic tunnel junction patterns may be oxidized to form the insulating layer, and a width of each of the magnetic tunnel junction patterns may be reduced whenever the pre-oxidation trim process is performed.

The patterning of the magnetic tunnel junction layer may include irradiating a first ion beam to the substrate, performing the sputter etch process of the pre-oxidation trim process may include irradiating a second ion beam to the substrate, and incident energy of the second ion beam may be less than incident energy of the first ion beam.

Embodiments may be realized by providing a method for manufacturing a device, the method including separating magnetic tunnel junction patterns from each other; oxidizing remaining metal material on sidewalls of the magnetic tunnel junction patterns after the sputtering process; and trimming oxidized metal material from the sidewalls of the magnetic tunnel junction patterns.

The separating may include a first sputtering process using argon ions; and trimming the oxidized metal material from the sidewalls of the magnetic tunnel junction patterns may include a second sputtering process including use of argon ions.

Oxidizing the metal material that remains on the sidewalls of the magnetic tunnel junction patterns after the separating and then trimming the oxidized metal material from the sidewalls of the magnetic tunnel junction patterns may be repeated at least once.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
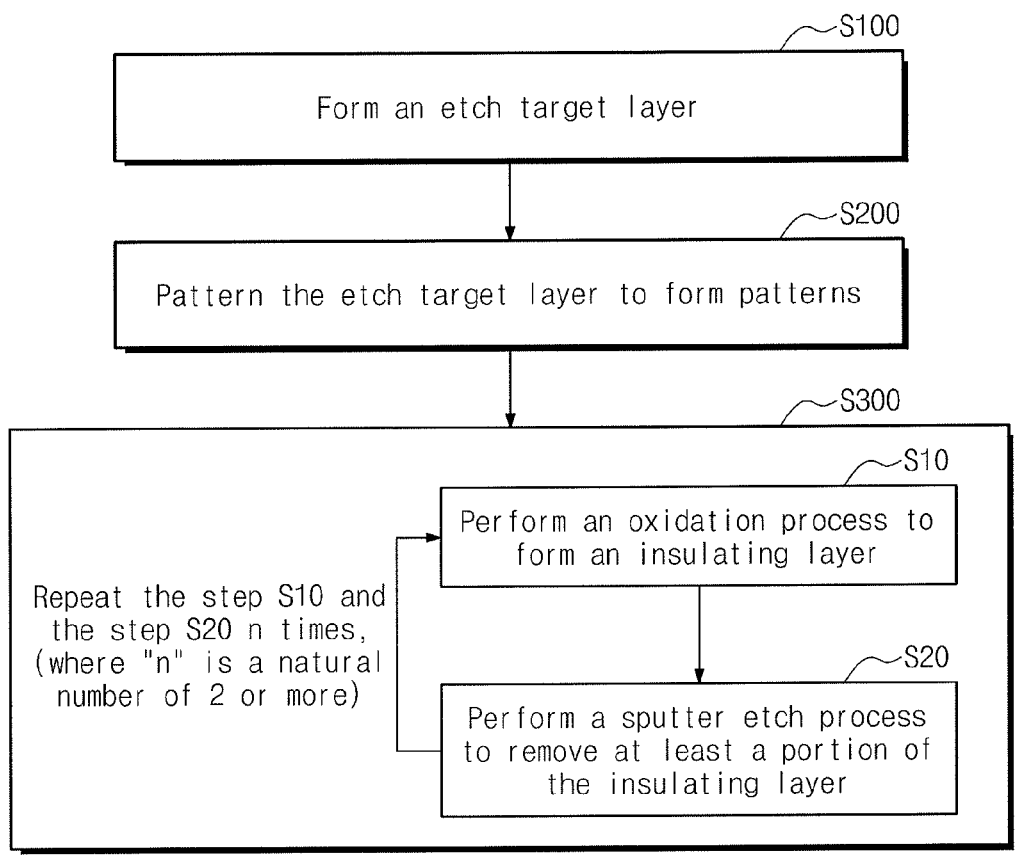
FIG. 1 illustrates a flow chart of a method for forming patterns, according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Moreover, exemplary embodiments are described herein with reference to cross-sectional views and/or plan views that are idealized exemplary views. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates a flow chart of a method for forming patterns, according to some embodiments. FIGS. 2A to 2L illustrate cross-sectional views of stages in the method for forming patterns, illustrated in FIG. 1.

Figure 2A:
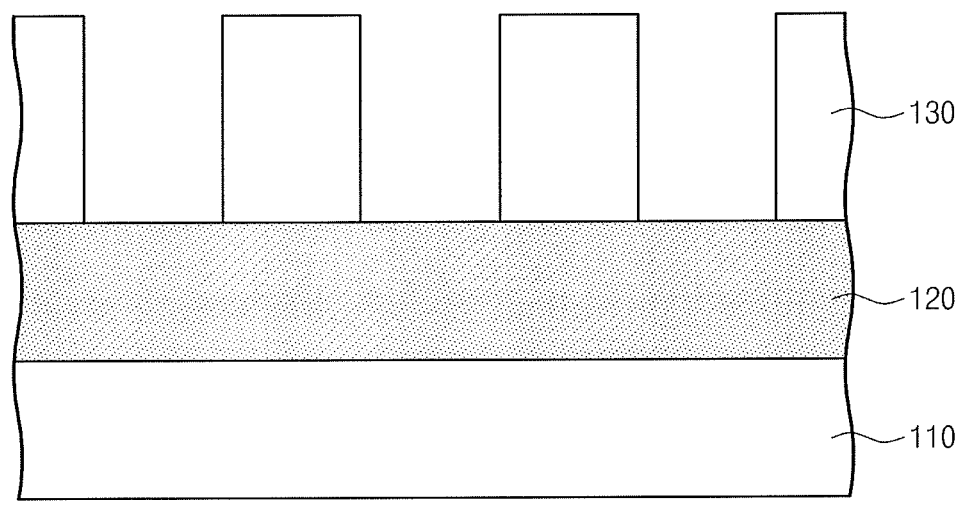
FIGS. 2A to 2L illustrate cross-sectional views of stages in the method for forming patterns, illustrated in FIG. 1.

FIG. 2A illustrates a cross-sectional view of operation S100 of FIG. 1. Referring to FIGS. 1 and 2A, an etch target layer 120 may be formed on a substrate 110 (S100). The substrate 110 may be a substrate including a selection element such as a transistor or a diode. The etch target layer 120 may include a conductive material. For example, the etch target layer 120 may include a metal material.

Mask patterns 130 may be formed on the etch target layer 120. In some embodiments, the mask patterns 130 may be conductive patterns. For example, the mask patterns 130 may include one or more tungsten, tantalum, aluminum, copper, gold, silver, titanium, or a conductive metal nitride including one thereof.

Figure 2B:
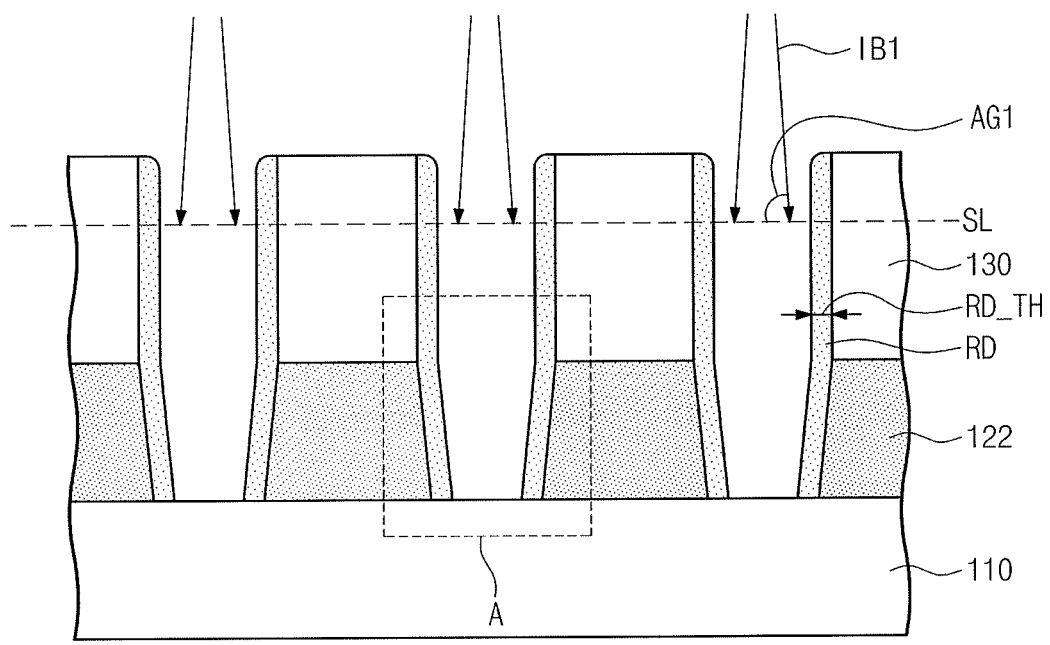
Figure 2C:
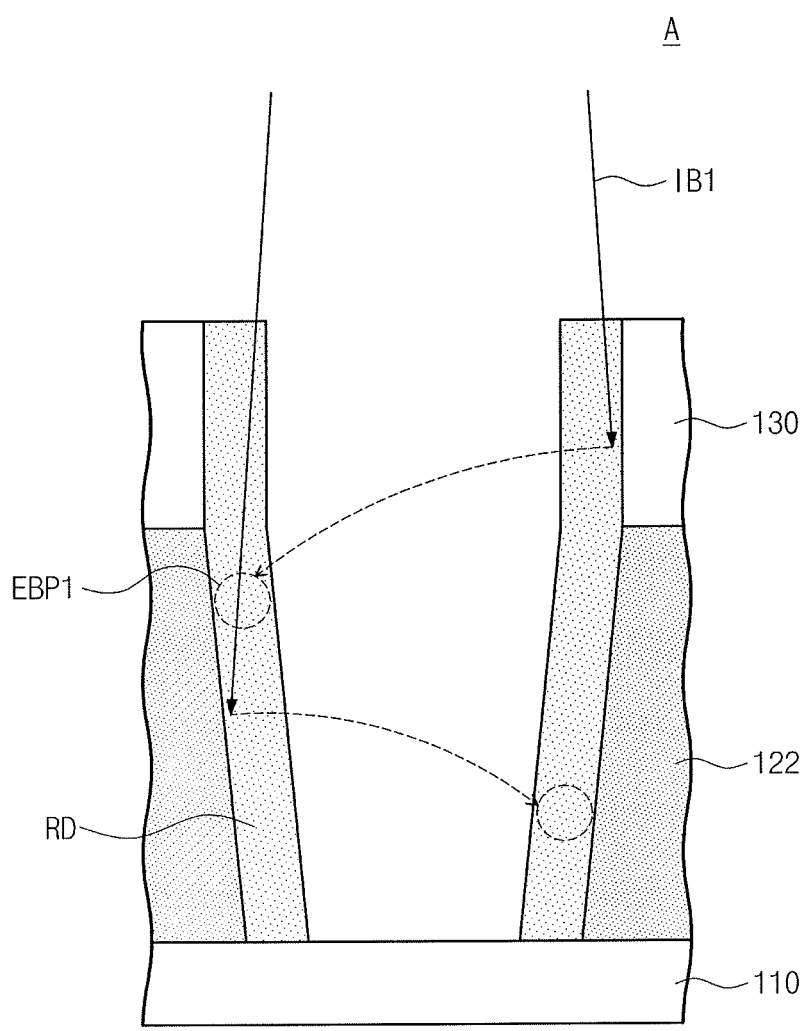

FIG. 2B illustrates a cross-sectional view of operation S200 of FIG. 1. FIG. 2C is an enlarged view of a portion 'A' of FIG. 2B. Referring to FIGS. 1, 2B, and 2C, the etch target layer 120 may be patterned using the mask patterns 130 as etch masks to form patterns 122 spaced apart from each other on the substrate 110 (S200).

Patterning the etch target layer 120 may be performed using a first sputter etch process. An ionized inert gas (e.g., argon ions ($Ar^+$)) may be provided above the substrate 110 during the first sputtering etch process. A first voltage may be applied to the ionized inert gas to accelerate the ionized inert gas, and a first ion beam IB1 may be provided to the substrate 110. The first ion beam IB1 may have first incident energy. The first incident energy may be proportional to the first voltage. In some embodiments, the first voltage may range from 1000V to 2000V.

The first ion beam IB1 may be irradiated to a surface of the etch target layer 120 at a first angle AG1 with respect to a reference line SL parallel to a top surface of the substrate 110. In some embodiments, the first angle AG1 may range from 60 degrees to 90 degrees. The etch target layer 120 may be etched by the first ion beam IB1 so as to be divided into the patterns 122. The substrate 110 may be rotated on a rotation axis perpendicular to the top surface of the substrate 110 during the irradiation of the first ion beam IB1, and the etch target layer 120 between the mask patterns 130 may be symmetrically etched.

During the first sputter etch process, a first etch by-product EBP1 generated from the etch target layer 120 and/or the mask patterns 130 may be re-deposited on a sidewall of each of the patterns 122 to form a re-deposited layer RD on the sidewall of each of patterns 122. In some embodiments, the first etch by-product EBP1 may also be re-deposited on sidewalls of the mask patterns 130, and the re-deposited layer RD may extend onto the sidewall of each of mask patterns 130. The re-deposited layer RD may include a metal material.

Figure 2D:
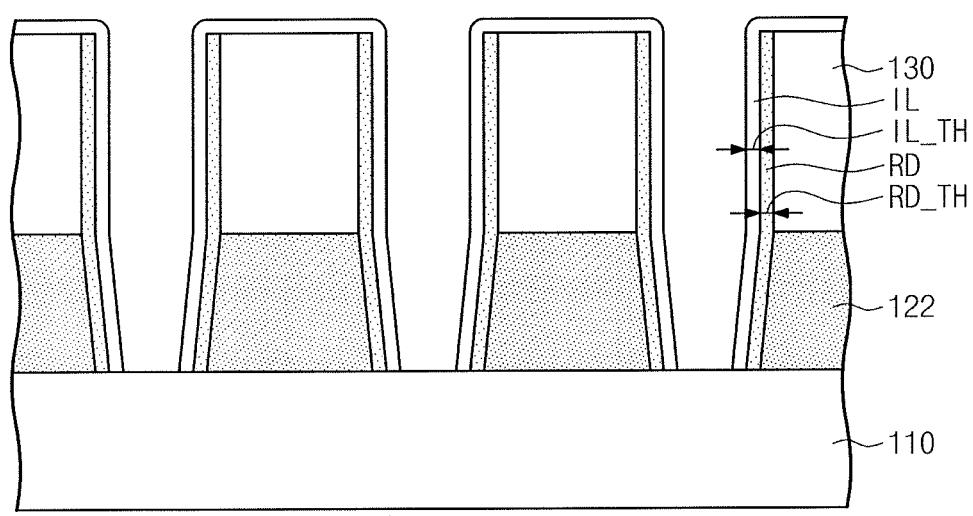
Figure 2E:
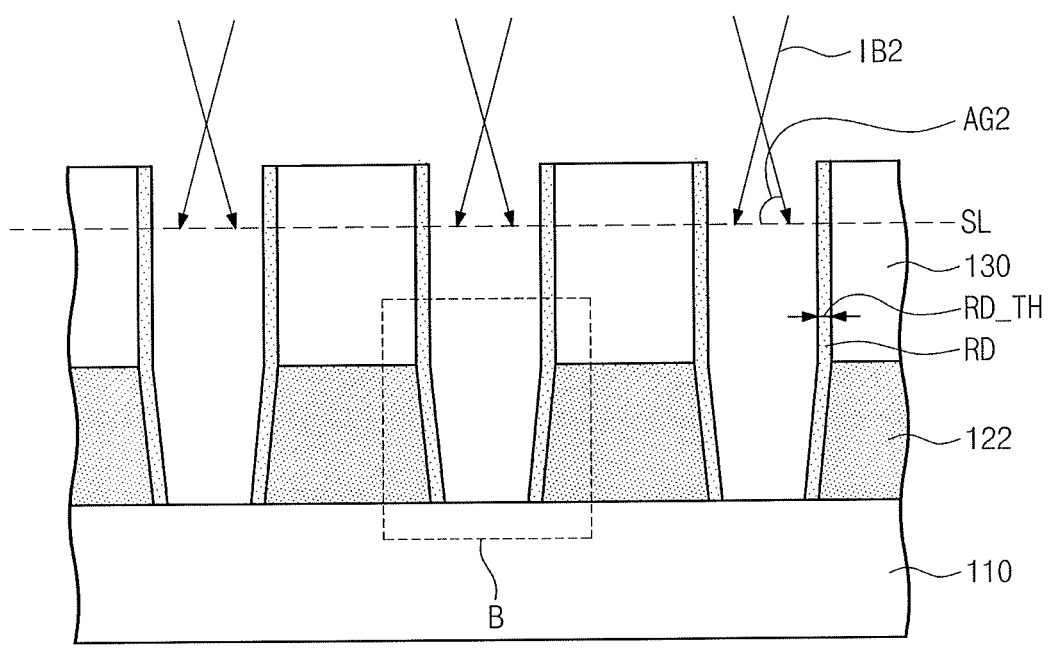
Figure 2F:
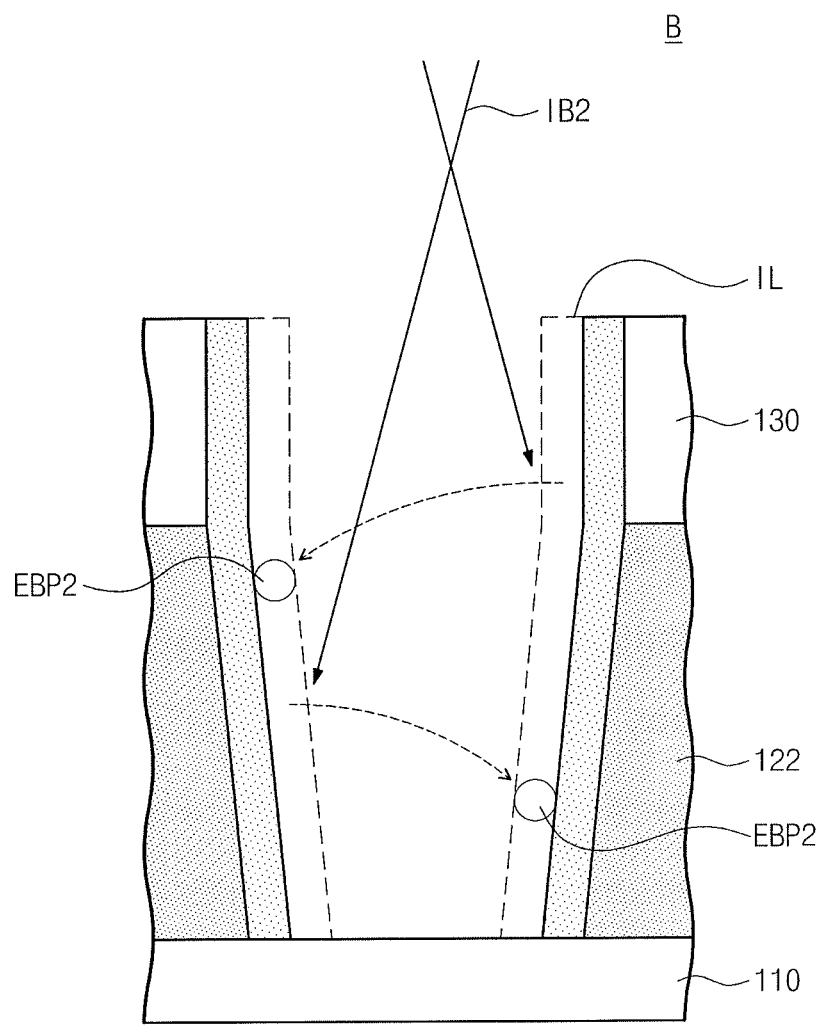

FIG. 2D illustrates a cross-sectional view of operation S10 of FIG. 1. FIG. 2E illustrates a cross-sectional view of operation S20 of FIG. 1. FIG. 2F is an enlarged view of a portion 'B' of FIG. 2E. Referring to FIGS. 1, 2D, 2E, and 2F, a pre-oxidation trim process may be performed (S300). The pre-oxidation trim process may include performing an oxidation process to form an insulating layer IL (S10) and performing a second sputter etch process to remove at least a portion of the insulating layer IL (S20).

Referring to FIGS. 1 and 2D, the oxidation process may be performed to form the insulating layer IL on the sidewall of each of the patterns 122 (S10). The formation of the insulating layer IL may include oxidizing at least a portion of the re-deposited layer RD, and a thickness RD_TH of the re-deposited layer RD may be reduced. An exposed surface of each of the mask patterns 130 may also be oxidized during the oxidation process, and the insulating layer IL may extend onto the surface of each of the mask patterns 130. A thickness IL_TH of the insulating layer IL may be in a range of about 10 Å to about 100 Å. In some embodiments, a portion of the re-deposited layer RD may be oxidized by the oxidation process but the other portion of the re-deposited layer RD may remain after the oxidation process, as illustrated in FIG. 2D. In embodiments, an entire portion of the re-deposited layer RD may be oxidized by the oxidation process, unlike FIG. 2D. The oxidation process may be performed by, for example, a sputtering process using oxygen or a reactive ion etching (RIE) process using the oxygen.

Next, referring to FIGS. 1, 2E, and 2F, the second sputter etch process may be performed to remove at least a portion of the insulating layer IL (S20). An ionized inert gas (e.g., argon ions ($Ar^+$)) may be provided above the substrate 110. A second voltage may be applied to the ionized inert gas to accelerate the ionized inert gas, and a second ion beam IB2 may be provided to the substrate 110. The second ion beam IB2 may have second incident energy, and the second incident energy may be proportional to the second voltage. In some embodiments, the second voltage may be less than the first voltage, and the second incident energy may be less than the first incident energy. For example, the second voltage may range from 50V to 200V.

The second ion beam IB2 may be irradiated to a surface of the insulating layer IL at a second angle AG2 with respect to the reference line SL parallel to the top surface of the substrate 110. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. The substrate 110 may be rotated on the rotation axis perpendicular to the top surface of the substrate 110 during the irradiation of the second ion beam IB2, and the insulating layer IL may be symmetrically etched.

In some embodiments, as illustrated in FIGS. 2E and 2F, the insulating layer IL may be removed by the second sputter etch process. In embodiments, unlike FIGS. 2E and 2F, a portion of the insulating layer IL may be etched by the second sputter etch process but the other portion of the insulating layer IL may remain after the second sputter etch process. The embodiment in which the insulating layer IL is removed by the second sputter etch process will be described hereinafter for the purpose of ease and convenience in explanation. The embodiments in which the insulating layer IL partially remains will be described later with reference to FIGS. 3A to 3C.

A second etch by-product EBP2 generated from the insulating layer IL may be re-deposited on the sidewalls of the patterns 122 during the second sputter etch process. The second etch by-product EBP2 may include the same material as the insulating layer IL. The second etch by-product EBP2 may include an insulating material.

Figure 2G:
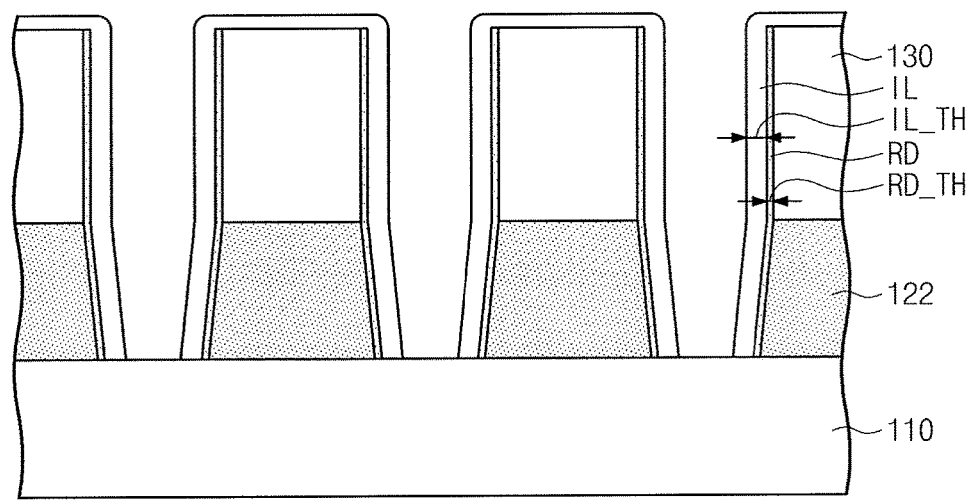
Figure 2H:
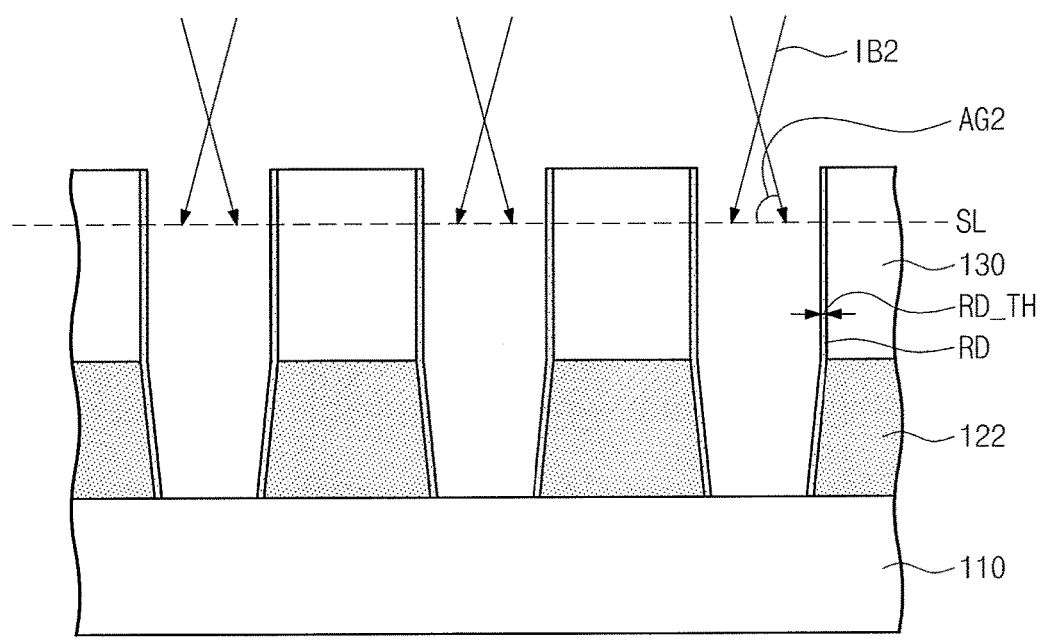

FIG. 2G illustrates a cross-sectional view of operation S10 of FIG. 1. FIG. 2H illustrates a cross-sectional view of operation S20 of FIG. 1. Referring to FIGS. 1, 2G, and 2H, the pre-oxidation trim process may be repeatedly performed (S300). The repeated pre-oxidation trim process may be the substantially same as the pre-oxidation trim process described with reference to FIGS. 1, 2D, 2E, and 2F.

Referring to FIGS. 1 and 2G, the oxidation process may be performed to form an insulating layer IL on the sidewall of each of the patterns 122 (S10). The formation of the insulating layer IL may include oxidizing at least a portion of the re-deposited layer RD, and the thickness RD_TH of the re-deposited layer RD may be further reduced. An exposed surface of each of the mask patterns 130 may also be oxidized during the oxidation process, and the insulating layer IL may extend onto the surface of each of the mask patterns 130. A thickness IL_TH of the insulating layer IL may be in a range of about 10 Å to about 100 Å.

Next, referring to FIGS. 1 and 2H, the second sputter etch process may be performed to remove at least a portion of the insulating layer IL (S20). The second ion beam IB2 may be provided to the substrate 110 having the insulating layer IL. The second ion beam IB2 may have the second incident energy less than the first incident energy.

The second ion beam IB2 may be irradiated to a surface of the insulating layer IL at the second angle AG2 with respect to the reference line SL parallel to the top surface of the substrate 110. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. In some embodiments, the insulating layer IL may be removed by the second sputter etch process, as illustrated in FIG. 2H.

As described with reference to FIG. 2F, a second etch by-product generated from the insulating layer IL may be re-deposited on the sidewalls of the patterns 122 during the second sputter etch process. The second etch by-product may include an insulating material.

Figure 2I:
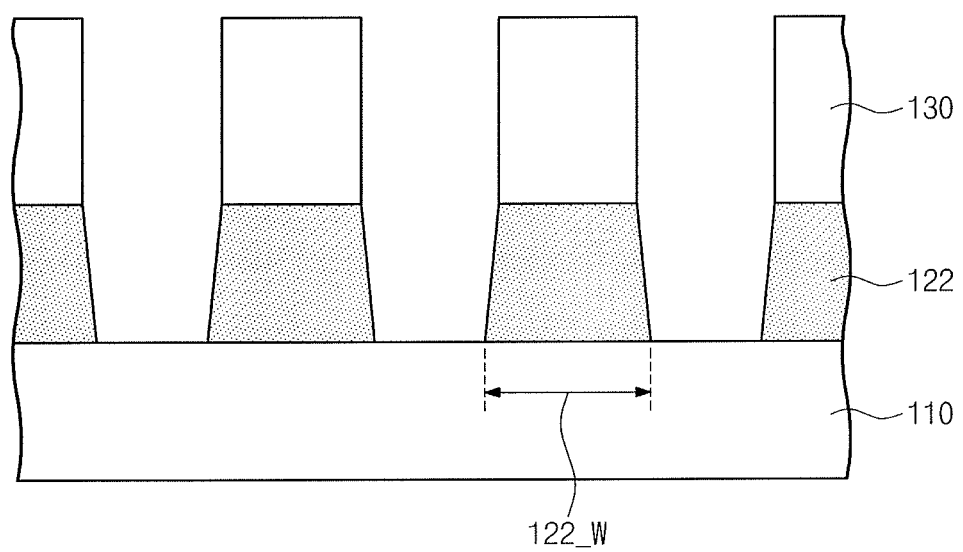

Referring to FIGS. 1 and 2I, the pre-oxidation trim process may be repeatedly performed to remove the re-deposited layer RD. As described above, the second etch by-product generated from the insulating layer IL may be re-deposited on the sidewalls of the patterns 122 during the second sputter etch process. The second etch by-product may include an insulating material.

Figure 2J:
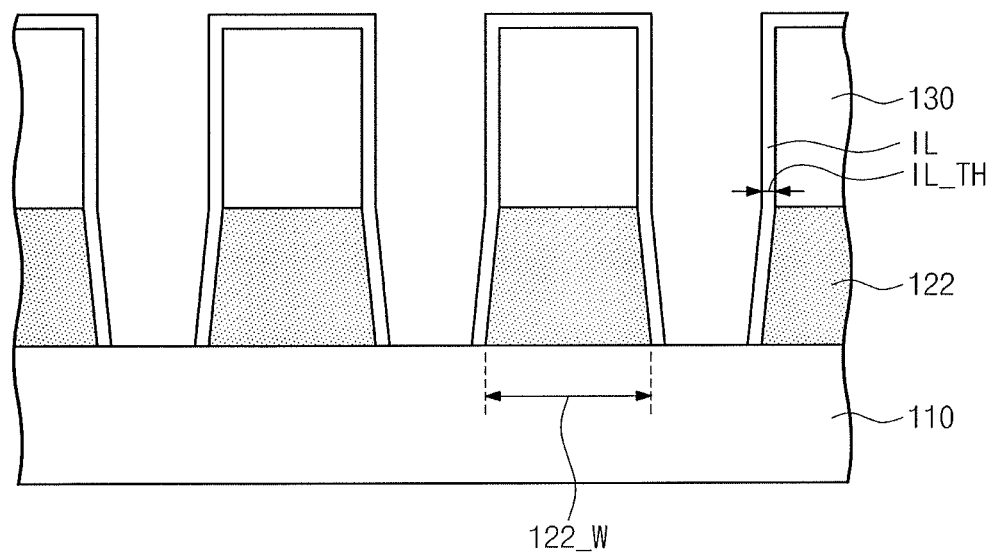
Figure 2K:
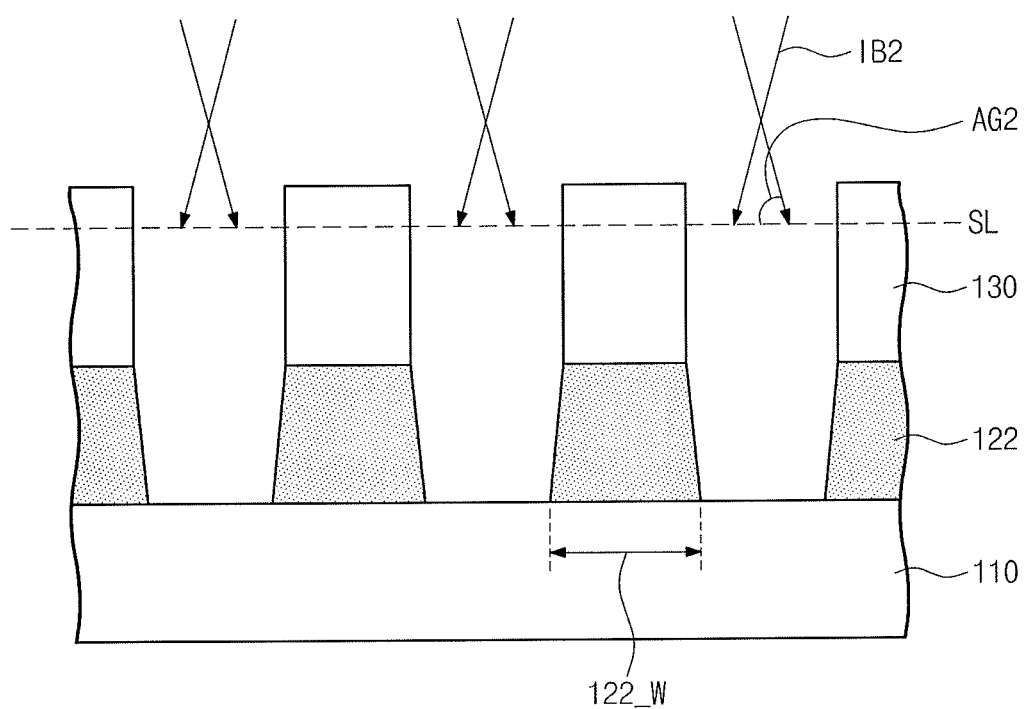

In some embodiments, the pre-oxidation trim process may be further performed as illustrated in FIGS. 2J and 2K. FIG. 2J illustrates a cross-sectional view of operation S10 of FIG. 1. FIG. 2K illustrates a cross-sectional view of operation S20 of FIG. 1. The pre-oxidation trim process of FIGS. 2J and 2K may be similar to the pre-oxidation trim process described with reference to FIGS. 2D to 2F. The pre-oxidation trim process of FIGS. 2J and 2K may include performing the oxidation process to form an insulating layer IL (S10) and performing the second sputter etch process to remove at least a portion of the insulating layer IL (S20).

Referring to FIGS. 1 and 2J, the oxidation process may be performed to form the insulating layer IL on the sidewall of each of the patterns 122 (S10). The formation of the insulating layer IL may include oxidizing each of the patterns 122 by a predetermined depth from the sidewall of the pattern 122, and a width 122_W of each of the patterns 122 may be reduced. An exposed surface of each of the mask patterns 130 may also be oxidized during the oxidation process, and the insulating layer IL may extend onto the surface of each of the mask patterns 130. A thickness IL_TH of the insulating layer IL may be in a range of about 10 Å to about 100 Å.

Next, referring to FIGS. 1 and 2K, the second sputter etch process may be performed to remove at least a portion of the insulating layer IL (S20). The second ion beam IB2 may be provided to the substrate 110 having the insulating layer IL. The second ion beam IB2 may have the second incident energy less than the first incident energy.

The second ion beam IB2 may be irradiated to a surface of the insulating layer IL at the second angle AG2 with respect to the reference line SL parallel to the top surface of the substrate 110. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. In some embodiments, the insulating layer IL may be removed by the second sputter etch process, as illustrated in FIG. 2K.

As described with reference to FIG. 2F, a second etch by-product generated from the insulating layer IL may be re-deposited on the sidewalls of the patterns 122 during the second sputter etch process. The second etch by-product may include an insulating material.

Figure 2L:
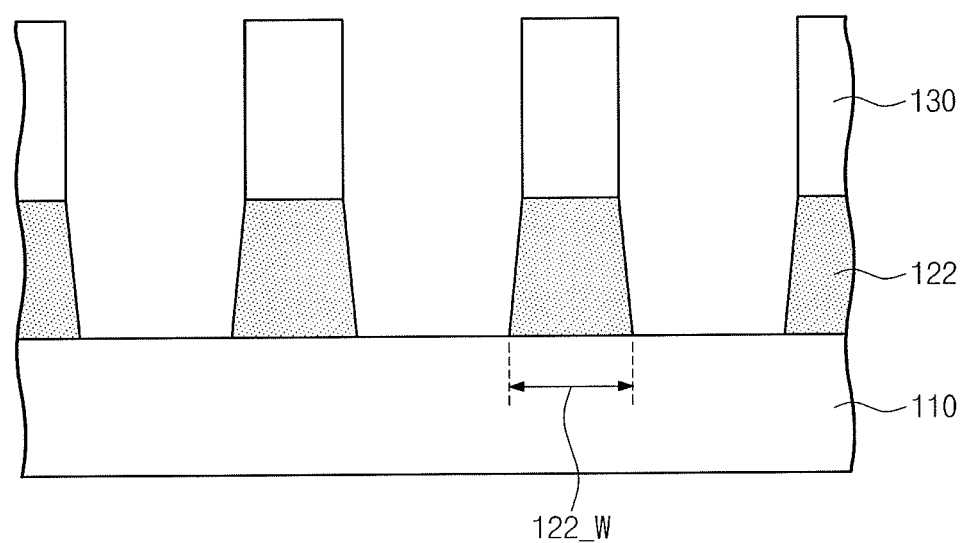

The pre-oxidation trim process described with reference to FIGS. 2J and 2K may be repeatedly performed one or more times. The width 122_W of each of the patterns 122 may be reduced whenever the pre-oxidation trim process is performed, and the width 122_W of each of the patterns 122 may be further reduced, as illustrated in FIG. 2L. The pre-oxidation trim process may be repeatedly performed until each of the patterns 122 has a sufficient small width 122_W.

Figure 3A:
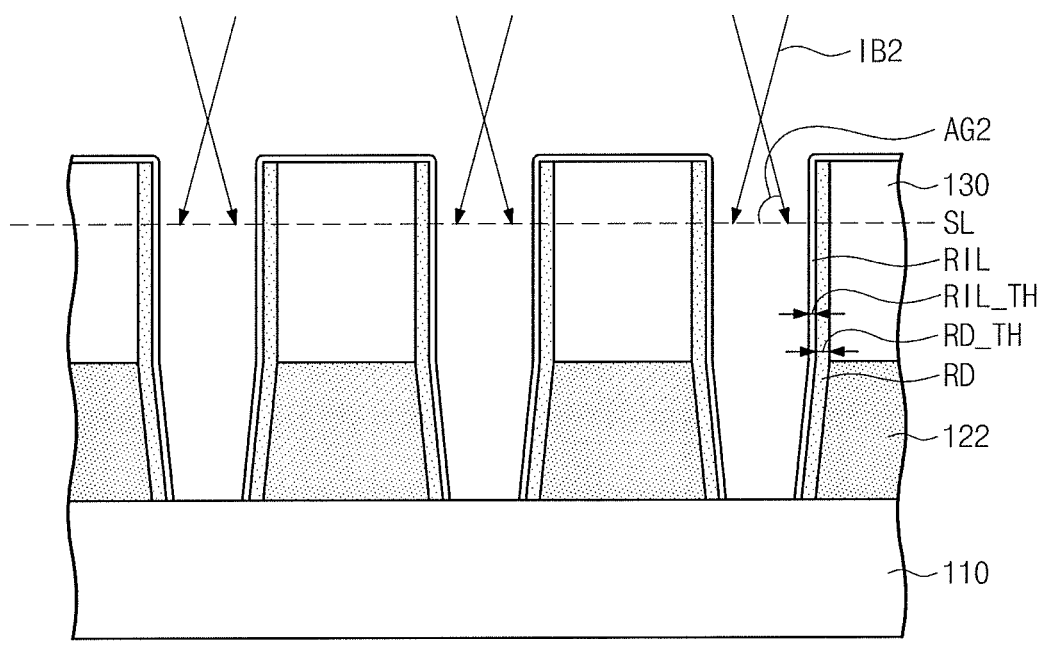
FIGS. 3A to 3C illustrate cross-sectional views of operation S300 of FIG. 1 according to some embodiments.
Figure 3B:
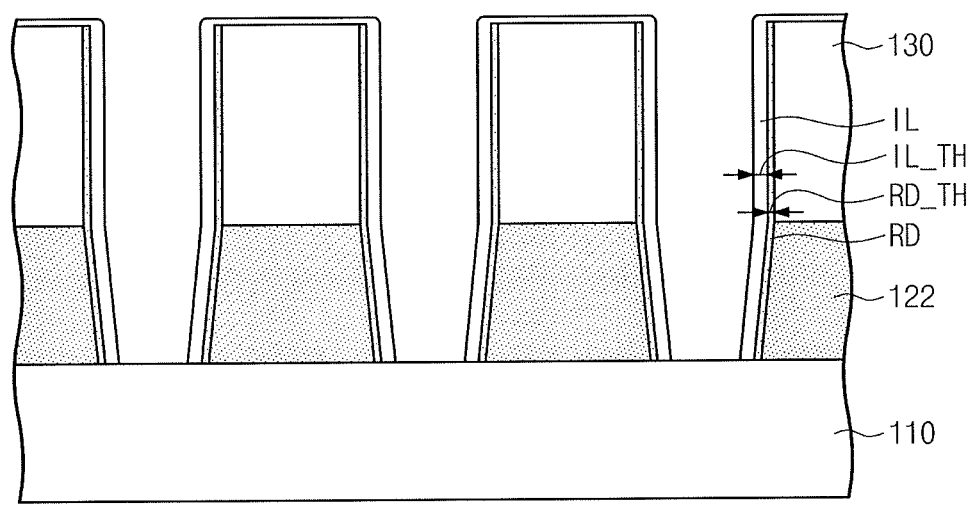
Figure 3C:
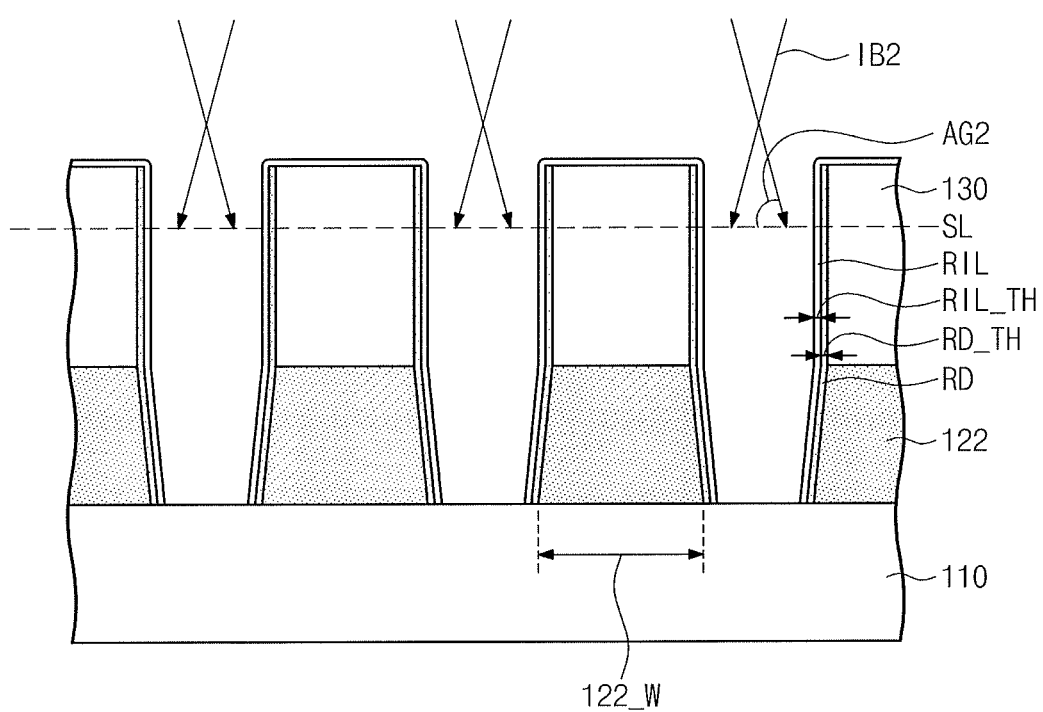

FIGS. 3A to 3C illustrate cross-sectional views of operation S300 of FIG. 1 according to some embodiments. FIG. 3A illustrates a cross-sectional view of operation S20 of FIG. 1.

Referring to FIGS. 1 and 3A, the second sputter etch process may be performed on the structure described with reference to FIG. 2D to remove a portion of the insulating layer IL (S20). The second ion beam IB2 may be provided to the substrate 110 having the insulating layer IL. The second ion beam IB2 may have the second incident energy less than the first incident energy.

The second ion beam IB2 may be irradiated to the surface of the insulating layer IL at the second angle AG2 with respect to the reference line SL parallel to the top surface of the substrate 110. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced.

According to the embodiment described with reference to FIG. 3A, only a portion of the insulating layer IL may be etched by the second sputter etch process but the other portion RIL of the insulating layer IL may remain after the second sputter etch process. A thickness RIL_TH of the remaining insulating layer RIL may be smaller than the thickness IL_TH of the insulating layer IL of FIG. 2D before the second sputter etch process. The remaining insulating layer RIL may cover the sidewall of each of the patterns 122. The remaining insulating layer RIL may extend to cover each of the mask patterns 130. As illustrated in FIG. 3A, in the case in which the re-deposited layer RD exists, the remaining insulating layer RIL may cover the re-deposited layer RD. The patterns 122, the mask patterns 130, and/or the re-deposited layer RD may be covered with the remaining insulating layer RIL, so they 122, 130 and may not be exposed.

As described with reference to FIG. 2F, the second etch by-product generated from the insulating layer IL may be re-deposited on the sidewalls of the patterns 122 during the second sputter etch process. The second etch by-product may include an insulating material.

FIG. 3B illustrates a cross-sectional view of operation S10 of FIG. 1. FIG. 3C illustrates a cross-sectional view of operation S20 of FIG. 1. Referring to FIGS. 1, 3B, and 3C, the pre-oxidation trim process may be repeatedly performed (S300). The repeated pre-oxidation trim process may be similar to the pre-oxidation trim process described with reference to FIGS. 1, 2D, and 3A.

Referring to FIGS. 1 and 3B, the oxidation process may be performed to form an insulating layer IL on the sidewall of each of the patterns 122 (S10). The formation of the insulating layer IL may include oxidizing at least a portion of the re-deposited layer RD, and the thickness RD_TH of the re-deposited layer RD may be further reduced. An exposed surface of each of the mask patterns 130 may also be oxidized during the oxidation process, and the insulating layer IL may extend onto the surface of each of the mask patterns 130. The remaining insulating layer RIL of FIG. 3A may be included in the insulating layer IL of FIG. 3B. A thickness IL_TH of the insulating layer IL may range from about 10 Å to about 100 Å.

Next, referring to FIGS. 1 and 3C, the second sputter etch process may be performed to remove a portion of the insulating layer IL (S20). The second ion beam IB2 may be provided to the substrate 110 having the insulating layer IL. The second ion beam IB2 may have the second incident energy less than the first incident energy.

The second ion beam IB2 may be irradiated to a surface of the insulating layer IL at the second angle AG2 with respect to the reference line SL parallel to the top surface of the substrate 110. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced.

According to the embodiment described with reference to FIG. 3C, only a portion of the insulating layer IL may be etched by the second sputter etch process but the other portion RIL of the insulating layer IL may remain after the second sputter etch process. A thickness RIL_TH of the remaining insulating layer RIL may be smaller than the thickness IL_TH of the insulating layer IL of FIG. 3B before the second sputter etch process. The remaining insulating layer RIL may cover the sidewall of each of the patterns 122. The remaining insulating layer RIL may extend to cover each of the mask patterns 130. As illustrated in FIG. 3C, in the case in which the re-deposited layer RD exists, the remaining insulating layer RIL may cover the re-deposited layer RD. The patterns 122, the mask patterns 130, and/or the re-deposited layer RD may be covered with the remaining insulating layer RIL and may not be exposed.

As described with reference to FIG. 2F, the second etch by-product generated from the insulating layer IL may be re-deposited on the sidewalls of the patterns 122 during the second sputter etch process. The second etch by-product may include an insulating material.

The pre-oxidation trim process described with reference to FIGS. 3B and 3C may be repeatedly performed, and the re-deposited layer RD may be removed. The width 122_W of each of the patterns 122 may be reduced.

In the method for forming the patterns according to some embodiments, the pre-oxidation trim process may be repeatedly performed to remove the re-deposited layer RD.

The pre-oxidation trim process may be repeatedly performed to reduce the width 122_W of each of the patterns 122 in the method for forming the patterns according to some embodiments, and it may be possible to form the patterns 122 having the widths smaller than the minimum width (or the minimum feature size) defined by a photolithography process.

The pre-oxidation trim process may include performing the oxidation process to form the insulating layer IL and performing the second sputter etch process to remove at least a portion of the insulating layer IL, and the etch by-product generated in the process of removing the re-deposited layer RD may include an insulating material.

Figure 4:
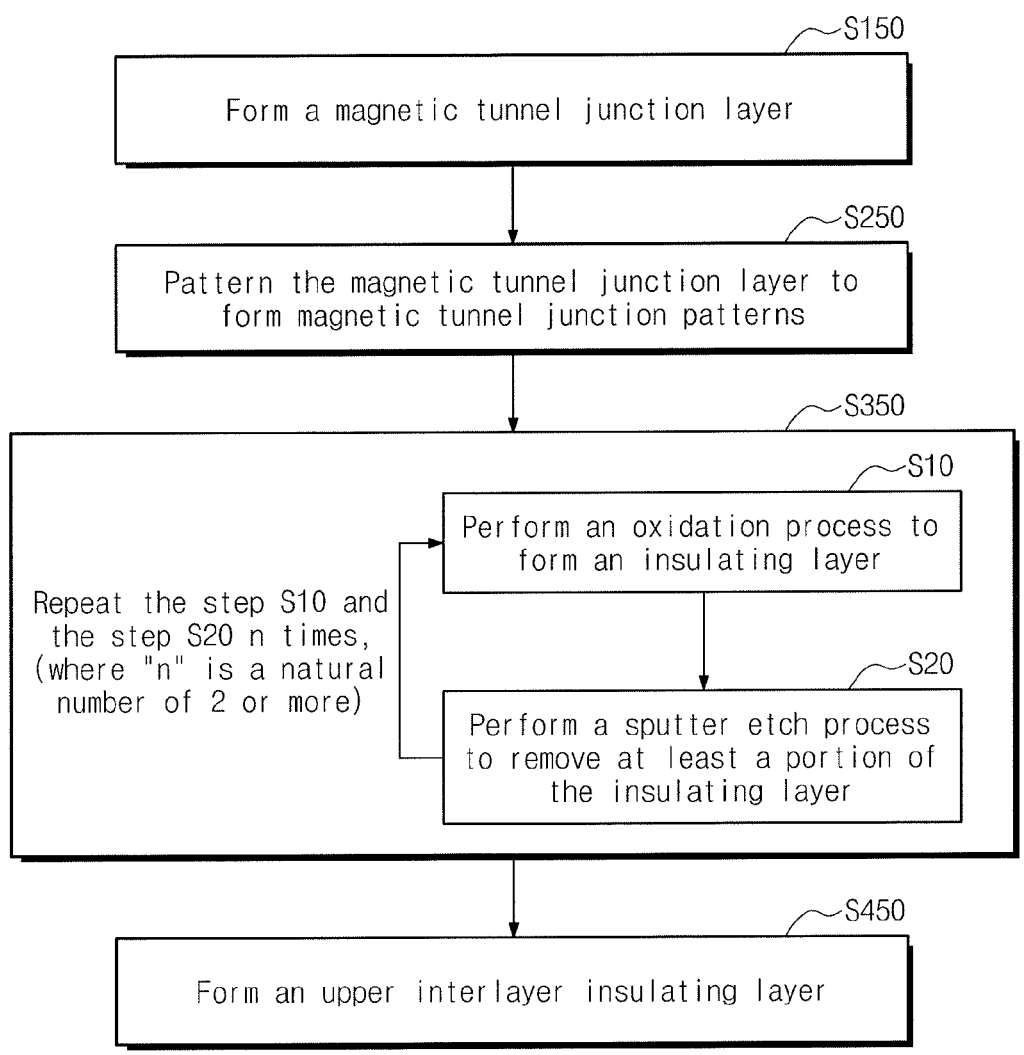
FIG. 4 illustrates a flow chart of a method for manufacturing a magnetic memory device, according to some embodiments.
Figure 5A:
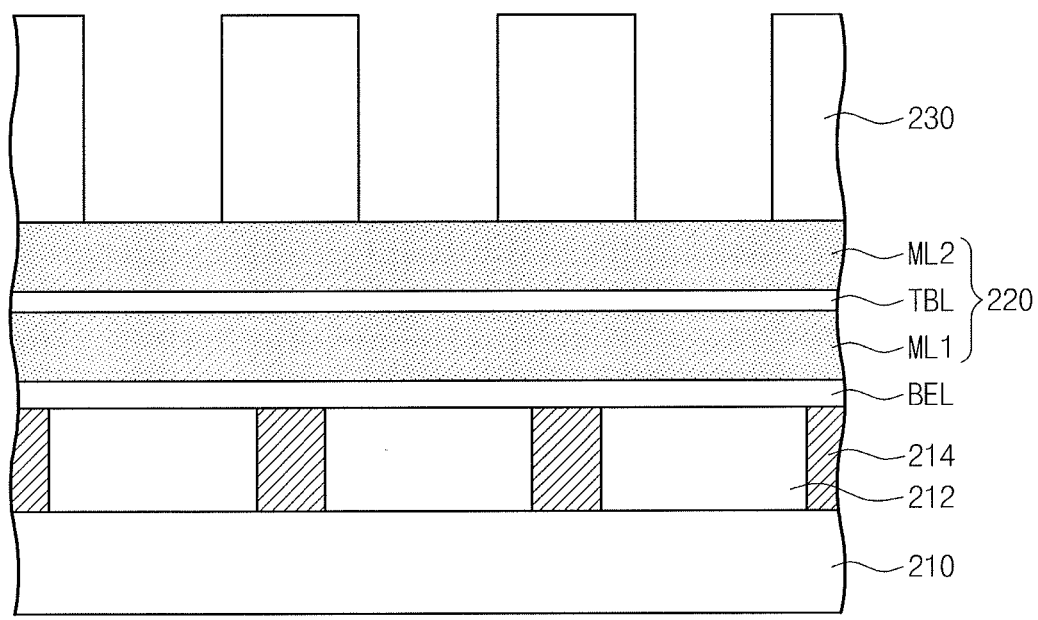
FIGS. 5A to 5N illustrate cross-sectional views of stages in a method for manufacturing a magnetic memory device, illustrated in FIG. 4.

FIG. 4 illustrates a flow chart of a method for manufacturing a magnetic memory device, according to some embodiments. FIGS. 5A to 5N illustrate cross-sectional views of stages in a method for manufacturing a magnetic memory device, illustrated in FIG. 4.

FIG. 5A illustrates a cross-sectional view of operation S150 of FIG. 4. Referring to FIGS. 4 and 5A, a lower interlayer insulating layer 212 may be formed on a substrate 210. The substrate 210 may include a semiconductor substrate. For example, the substrate 210 may include a silicon substrate, a germanium substrate, or a silicon-germanium substrate. In some embodiments, selection elements (not shown) may be formed on the substrate 210, and the lower interlayer insulating layer 212 may be formed to cover the selection elements. The selection elements may be field effect transistors or diodes. The lower interlayer insulating layer 212 may include one or more of silicon oxide, silicon nitride, or silicon oxynitride.

Lower contact plugs 214 may be formed in the lower interlayer insulating layer 212. Each of the lower contact plugs 214 may penetrate the lower interlayer insulating layer 212 so as to be electrically connected to a corresponding one of the selection elements. The lower contact plugs 214 may include one or more of a doped semiconductor material (e.g., doped silicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide).

A magnetic tunnel junction layer 220 may be formed on the substrate 210 (S150). The magnetic tunnel junction layer 220 may be formed on the lower interlayer insulating layer 212. A bottom electrode layer BEL may be formed between the lower interlayer insulating layer 212 and the magnetic tunnel junction layer 220. The bottom electrode layer BEL may include a conductive metal nitride such as titanium nitride and/or tantalum nitride.

The magnetic tunnel junction layer 220 may include a first magnetic layer ML1, a tunnel barrier layer TBL, and a second magnetic layer ML2 which are sequentially stacked on the bottom electrode layer BEL. One of the first and second magnetic layers ML1 and ML2 may correspond to a pinned layer (or a reference layer) having a magnetization direction fixed in one direction, and the other of the first and second magnetic layers ML1 and ML2 may correspond to a free layer having a magnetization direction changeable to be parallel or anti-parallel to the fixed magnetization direction of the pinned layer. The magnetic tunnel junction layer 220 will be described later in detail with reference to FIGS. 7A and 7B.

Conductive mask patterns 230 may be formed on the magnetic tunnel junction layer 220. The conductive mask patterns 230 may include one or more of, for example, tungsten, tantalum, aluminum, copper, gold, silver, titanium, or a conductive metal nitride including one thereof. The conductive mask patterns 230 may define regions in which magnetic tunnel junction patterns to be described later will be formed.

Figure 5B:
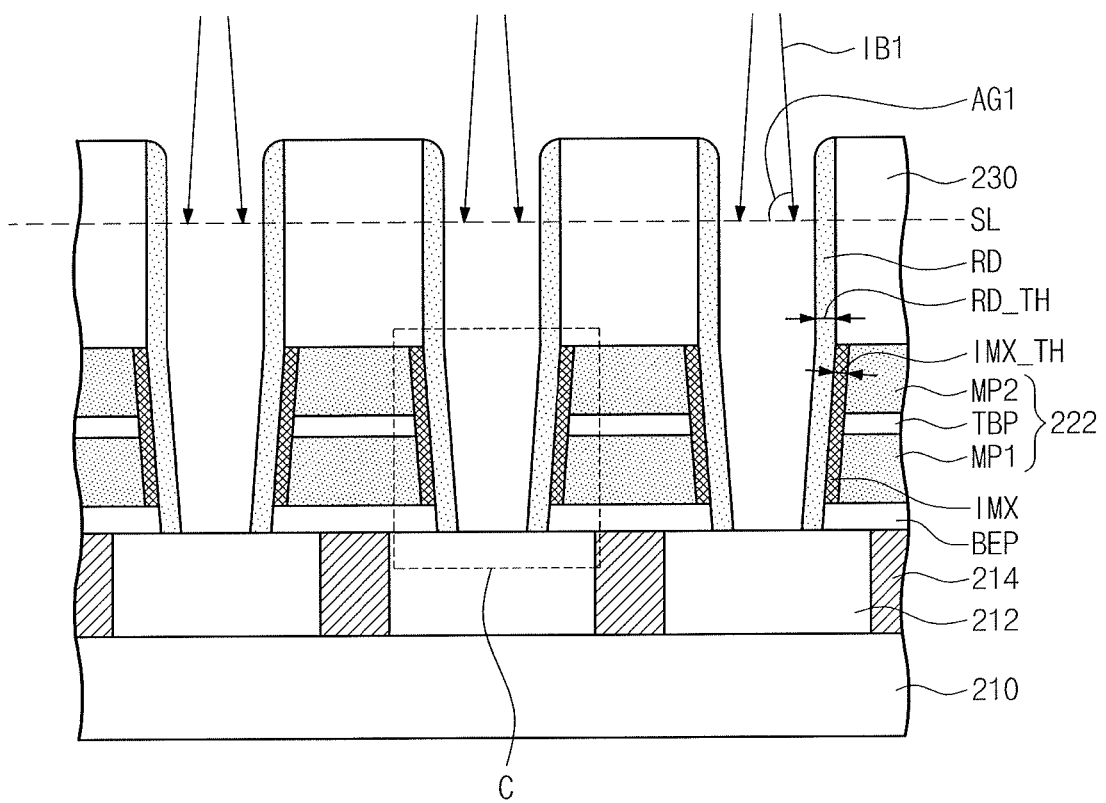
Figure 5C:
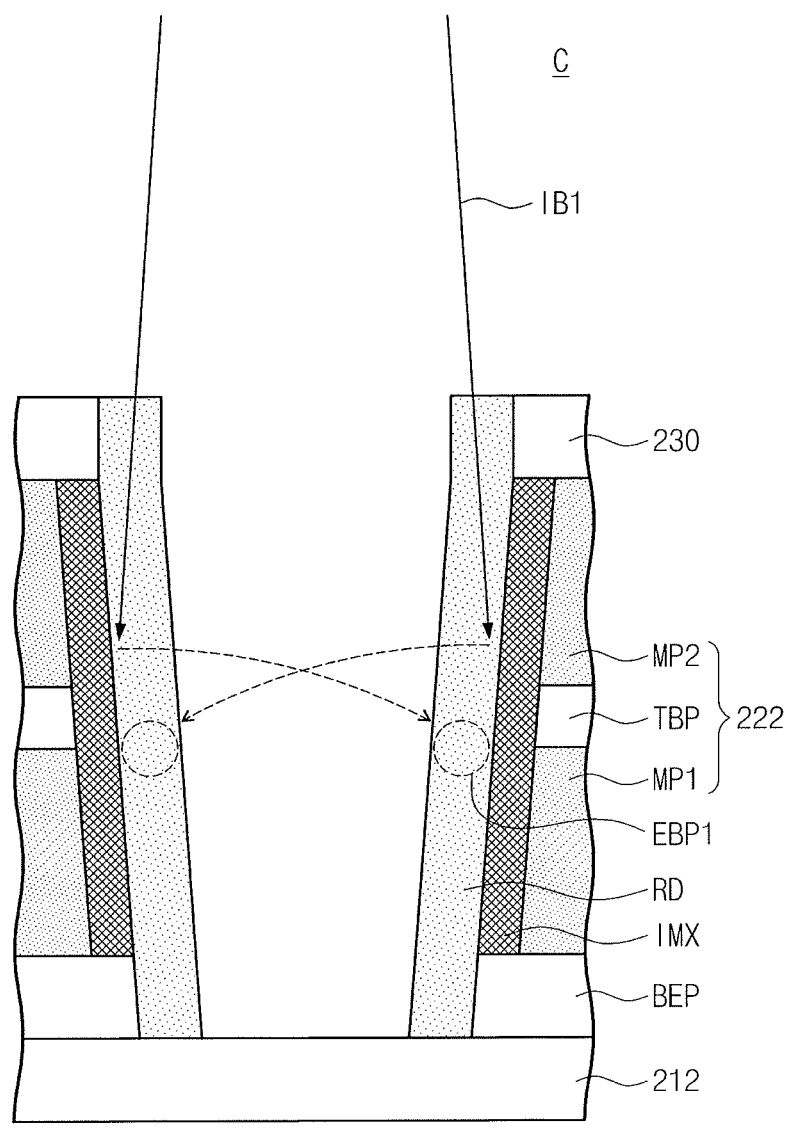

FIG. 5B illustrates a cross-sectional view of operation S250 of FIG. 4. FIG. 5C is an enlarged view of a portion 'C' of FIG. 5B. Referring to FIGS. 4, 5B, and 5C, the magnetic tunnel junction layer 220 may be patterned using the conductive mask patterns 230 as etch masks to form magnetic tunnel junction patterns 222 spaced apart from each other on the substrate 210 (S250).

Patterning the magnetic tunnel junction layer 220 may be performed using a first sputter etch process. The first sputter etch process may be similar to the first sputter etch process described with reference to FIGS. 1, 2B, and 2C.

A first ion beam IB1 may be provided to the substrate 210 on which the magnetic tunnel junction layer 220 is formed. The first ion beam IB1 may have first incident energy.

The first ion beam IB1 may be irradiated to a surface of the magnetic tunnel junction layer 220 at a first angle AG1 with respect to a reference line SL parallel to a top surface of the substrate 210. In some embodiments, the first angle AG1 may range from 60 degrees to 90 degrees. The magnetic tunnel junction layer 220 may be etched by the first ion beam IB1 so as to be divided into the magnetic tunnel junction patterns 222. Each of the magnetic tunnel junction patterns 222 may include a first magnetic pattern MP1 formed from the first magnetic layer ML1, a tunnel barrier pattern TBP formed from the tunnel barrier layer TBL, and a second magnetic pattern MP2 formed from the second magnetic layer ML2. The magnetic tunnel junction pattern 222 will be described later in more detail with reference to FIGS. 7A and 7B. The substrate 210 may be rotated on a rotation axis perpendicular to the top surface of the substrate 210 during the irradiation of the first ion beam IB1, and the magnetic tunnel junction layer 220 between the conductive mask patterns 230 may be symmetrically etched.

The bottom electrode layer BEL may be etched by the first sputter etch process to form bottom electrode patterns BEP spaced apart from each other on the substrate 210. The bottom electrode patterns BEP may be electrically connected to the lower contact plugs 214, respectively. The magnetic tunnel junction patterns 222 may be formed on the bottom electrode patterns BEP, respectively.

An intermixing layer IMX may be formed on a sidewall of each of the magnetic tunnel junction patterns 222 during the first sputter etch process. Materials included in the first magnet pattern MP1, the second magnetic pattern MP2 and the tunnel barrier pattern TBP may be intermixed with each other by the first ion beam IB1 colliding with the sidewall of each of the magnetic tunnel junction patterns 222, and the intermixing layer IMX may be formed. The intermixing layer IMX may include the materials which are included in the first magnet pattern MP1, the second magnetic pattern MP2 and the tunnel barrier pattern TBP, respectively. The intermixing layer IMX may have conductivity.

During the first sputter etch process, a first etch by-product EBP1 generated from the magnetic tunnel junction layer 220 and/or the conductive mask patterns 230 may be re-deposited on the sidewall of each of the magnetic tunnel junction patterns 222 to form a re-deposited layer RD. The re-deposited layer RD may have conductivity. In some embodiments, the first etch by-product EBP1 may also be re-deposited on sidewalls of the bottom electrode patterns BEP and sidewalls of the conductive mask patterns 230, and the re-deposited layer RD may extend onto the sidewall of the bottom electrode pattern BEP and the sidewall of the conductive mask pattern 230.

Figure 5D:
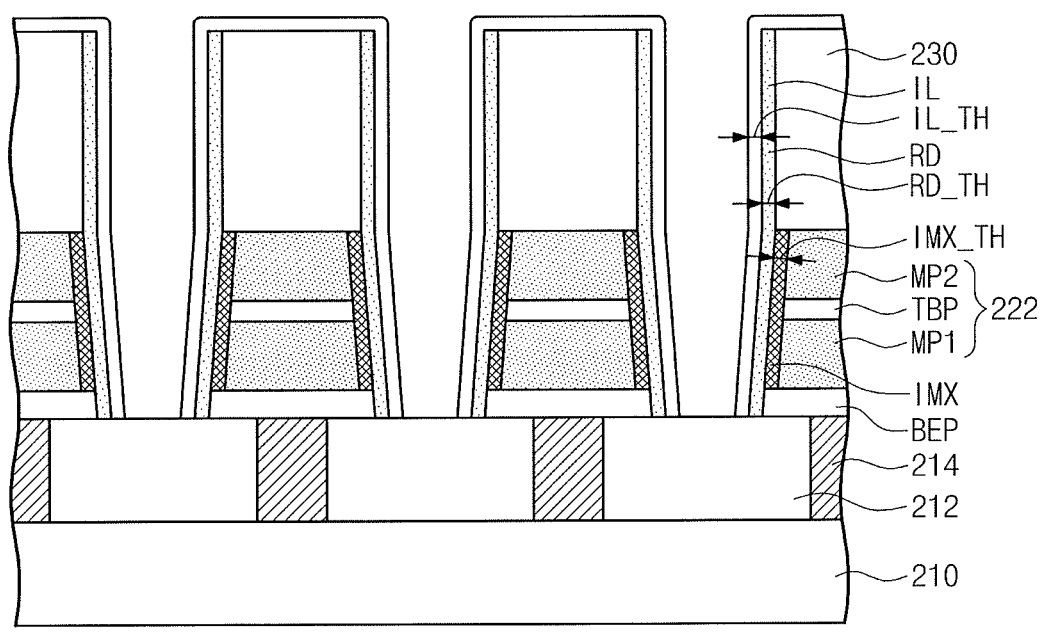
Figure 5E:
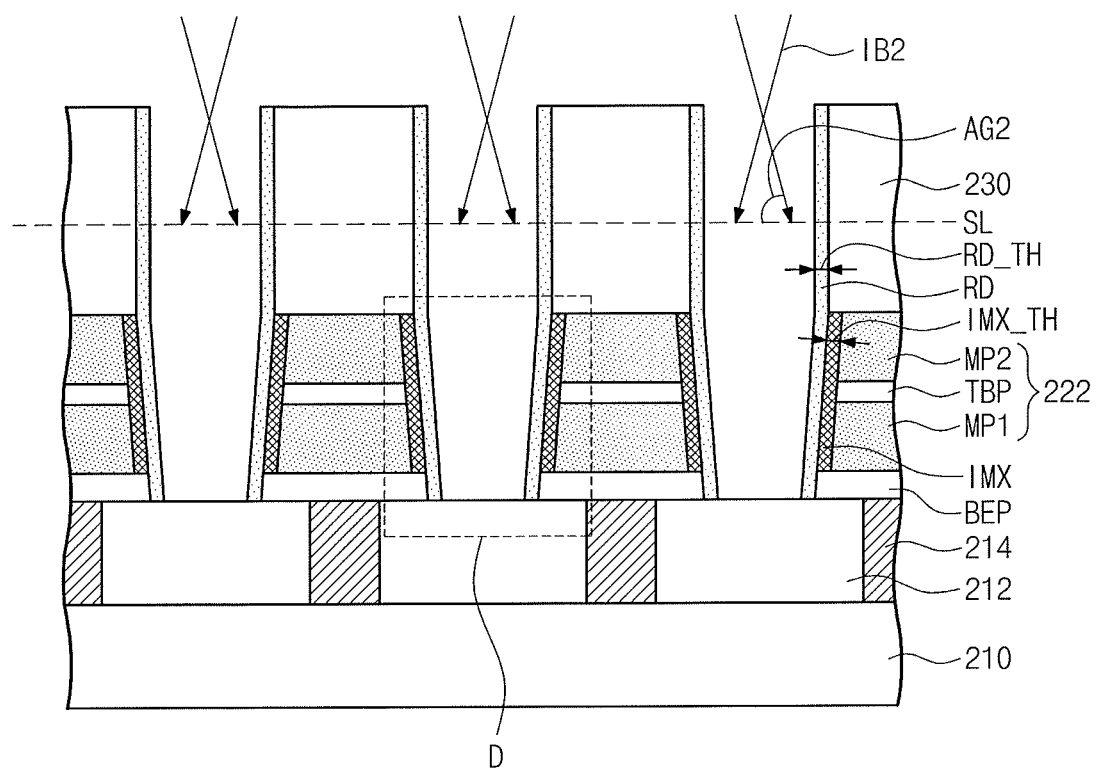
Figure 5F:
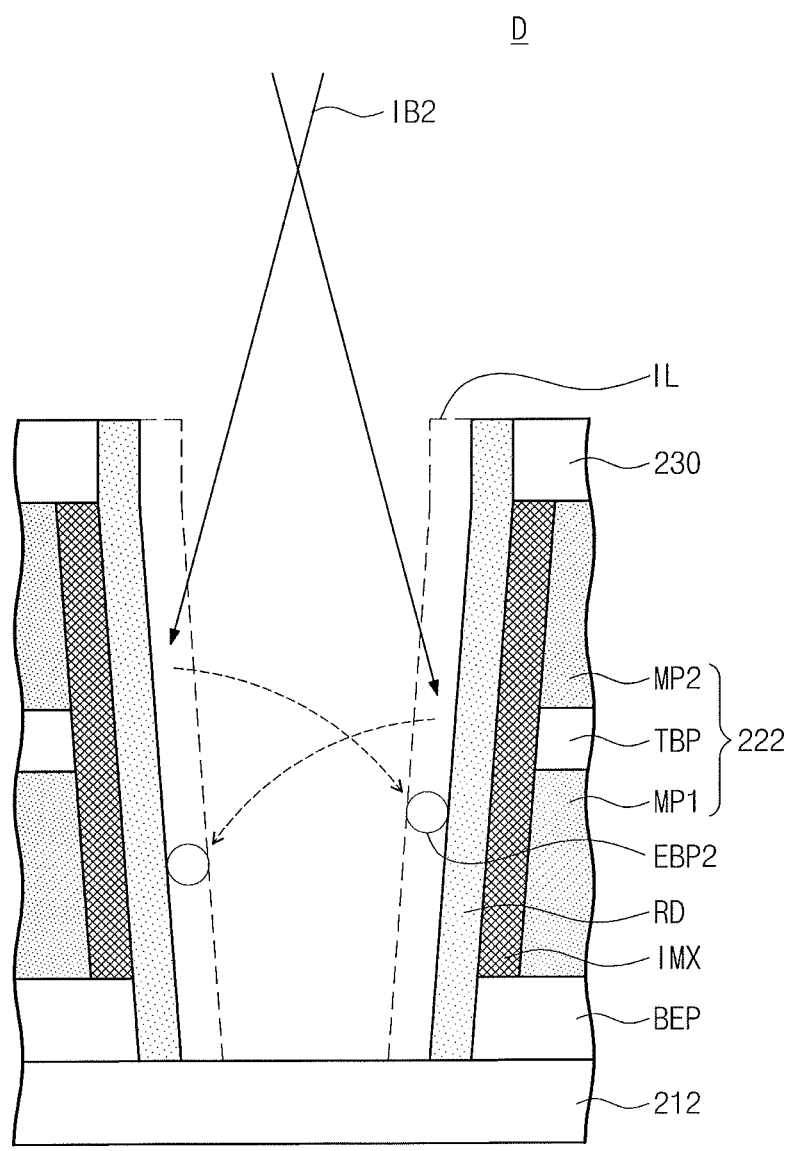

FIG. 5D illustrates a cross-sectional view of operation S10 of FIG. 4. FIG. 5E illustrates a cross-sectional view of operation S20 of FIG. 4. FIG. 5F is an enlarged view of a portion 'D' of FIG. 5E. Referring to FIGS. 4, 5D, 5E, and 5F, a pre-oxidation trim process may be performed (S350). The pre-oxidation trim process of FIGS. 4 and 5D to 5F may be similar to the pre-oxidation trim process described with reference to FIGS. 1 and 2D to 2F.

Referring to FIGS. 4 and 5D, an oxidation process may be performed to form an insulating layer IL on the sidewall of each of the magnetic tunnel junction patterns 222 (S10). Forming the insulating layer IL may include oxidizing at least a portion of the re-deposited layer RD, and a thickness RD_TH of the re-deposited layer RD may be reduced. The sidewalls of the bottom electrode patterns BEP and exposed surfaces of the conductive mask patterns 230 may also be oxidized during the oxidation process, and the insulating layer IL may extend onto the sidewall of each of the bottom electrode patterns BEP and the surface of each of the conductive mask patterns 230. A thickness IL_TH of the insulating layer IL may be in a range of about 10 Å to about 100 Å.

Next, referring to FIGS. 4, 5E, and 5F, a second sputter etch process may be performed to remove at least a portion of the insulating layer IL (S20). A second ion beam IB2 may be provided to the substrate 210 on which the insulating layer IL is formed. The second ion beam IB2 may have second incident energy less than the first incident energy.

The second ion beam IB2 may be irradiated to a surface of the insulating layer IL at a second angle AG2 with respect to the reference line SL parallel to the top surface of the substrate 210. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. In some embodiments, the insulating layer IL may be removed by the second sputter etch process, as illustrated in FIGS. 5E and 5F. In embodiments, unlike FIGS. 5E and 5F, only a portion of the insulating layer IL may be etched by the second sputter etch process but the other portion of the insulating layer IL may remain after the second sputter etch process. The embodiment in which the insulating layer IL is removed by the second sputter etch process will be described hereinafter for the purpose of ease and convenience in explanation. The embodiments in which a portion of the insulating layer IL remains after the second sputter etch process will be described later with reference to FIGS. 6A to 6C.

A second etch by-product EBP2 generated from the insulating layer IL may be re-deposited on the sidewalls of the magnetic tunnel junction patterns 222 during the second sputter etch process. The second etch by-product EBP2 may include the same material as the insulating layer IL. The second etch by-product EBP2 may include an insulating material.

Figure 5G:
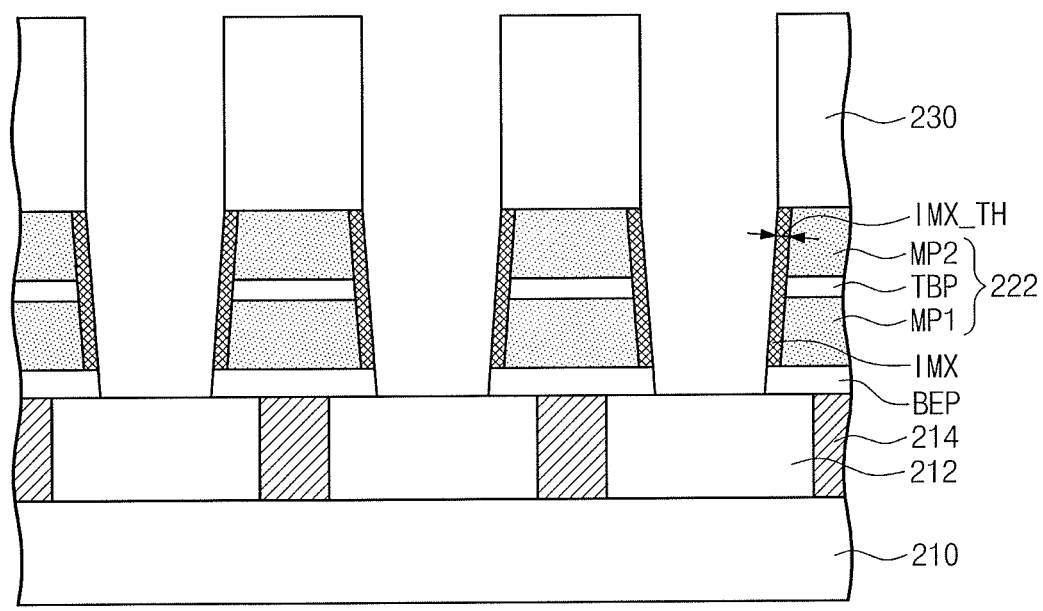

Referring to FIGS. 4 and 5G, the pre-oxidation trim process may be repeatedly performed to remove the re-deposited layer RD (S350). As described above, the second etch by-product generated from the insulating layer IL may be re-deposited on the sidewalls of the magnetic tunnel junction patterns 222 during the second sputter etch process repeated. The second etch by-product may be formed of an insulating material.

Figure 5H:
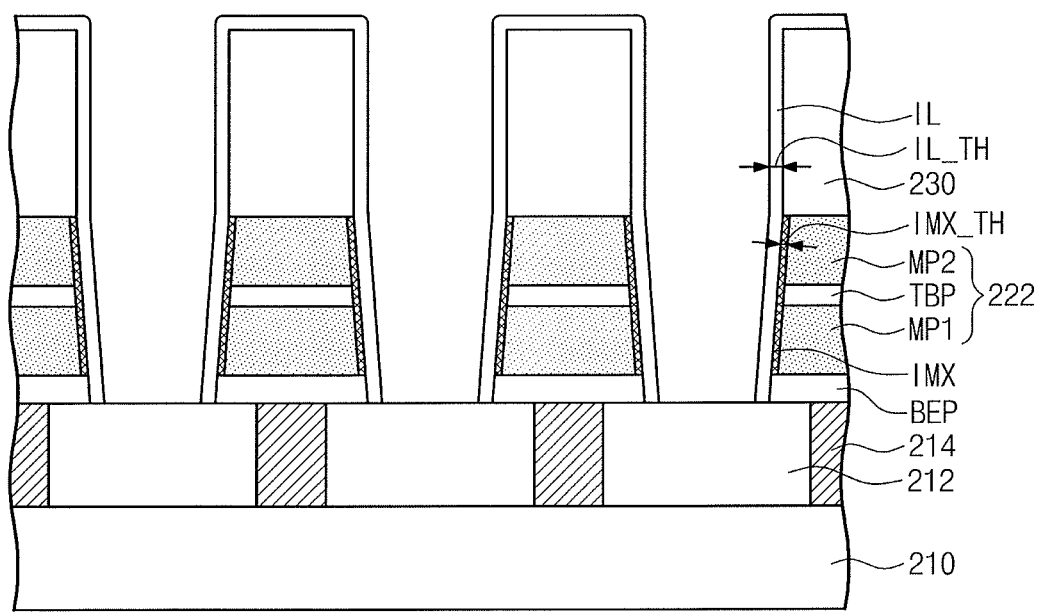
Figure 5I:
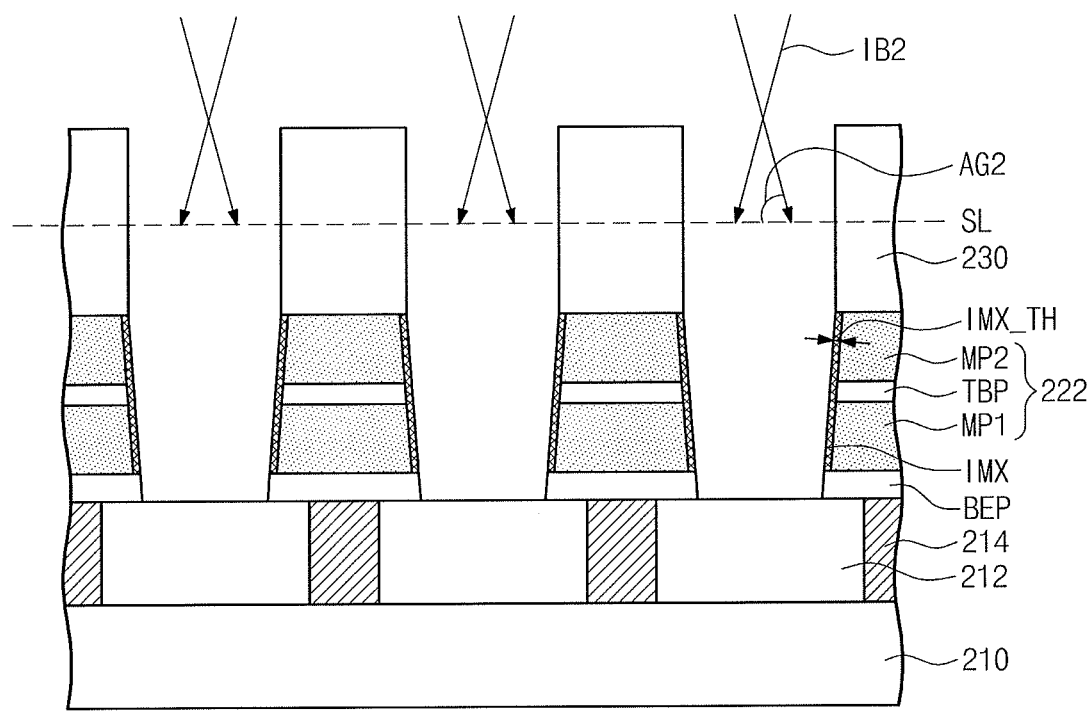

In some embodiments, as illustrated in FIGS. 5H and 5I, the pre-oxidation trim process may be further repeated. FIG. 5H illustrates a cross-sectional view of operation S10 of FIG. 4. FIG. 5I illustrates a cross-sectional view of operation S20 of FIG. 4. The pre-oxidation trim process of FIGS. 5H and 5I may be similar to the pre-oxidation trim process described with reference to FIGS. 5D to 5F. The pre-oxidation trim process of FIGS. 5H and 5I may include performing the oxidation process to form an insulating layer IL (S10) and performing the second sputter etch process to remove at least a portion of the insulating layer IL (S20).

Referring to FIGS. 4 and 5H, the oxidation process may be performed to form an insulating layer IL on the sidewall of each of the magnetic tunnel junction patterns 222 (S10). Forming the insulating layer IL may include oxidizing at least a portion of the intermixing layer IMX, and a thickness IMX_TH of the intermixing layer IMX may be reduced. The sidewalls of the bottom electrode patterns BEP and exposed surfaces of the conductive mask patterns 230 may also be oxidized during the oxidation process, and the insulating layer IL may extend onto the sidewall of each of the bottom electrode patterns BEP and the surface of each of the conductive mask patterns 230. A thickness IL_TH of the insulating layer IL may be in a range of about 10 Å to about 100 Å.

Next, referring to FIGS. 4 and 5I, the second sputter etch process may be performed to remove at least a portion of the insulating layer IL (S20). The second ion beam IB2 may be provided to the substrate 210 on which the insulating layer IL is formed. The second ion beam IB2 may have the second incident energy less than the first incident energy.

The second ion beam IB2 may be irradiated to a surface of the insulating layer IL at the second angle AG2 with respect to the reference line SL parallel to the top surface of the substrate 210. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. In some embodiments, the insulating layer IL may be removed by the second sputter etch process, as illustrated in FIG. 5I.

Figure 5J:
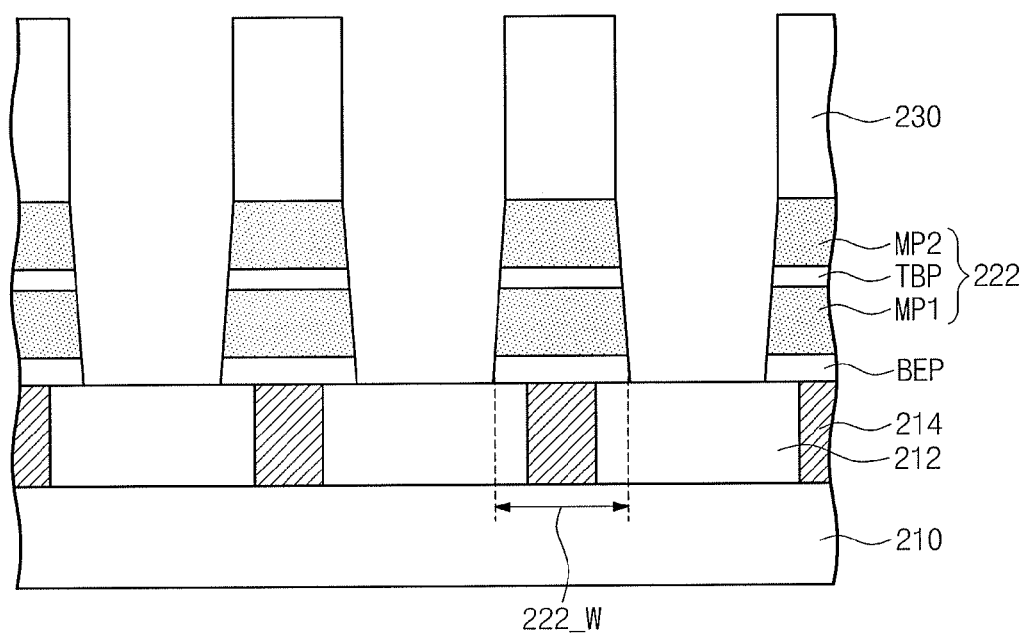

Referring to FIGS. 4 and 5J, the pre-oxidation trim process may be repeatedly performed to remove the intermixing layer IMX (S350). As described above, the second etch by-product generated from the insulating layer IL may be re-deposited on the sidewalls of the magnetic tunnel junction patterns 222 during the second sputter etch process. The second etch by-product may be formed of an insulating material.

Figure 5K:
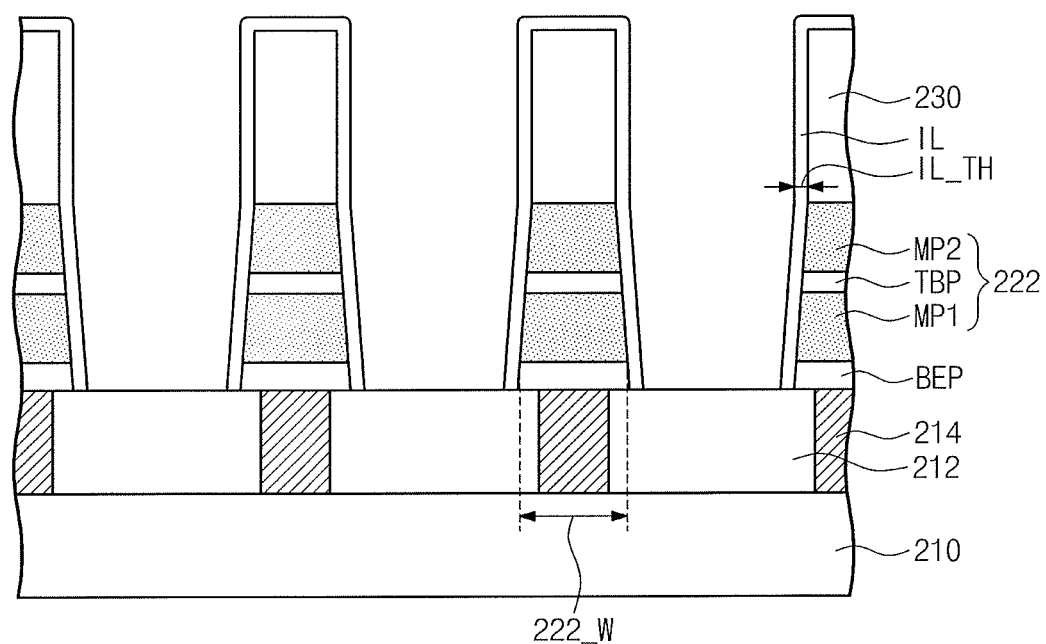
Figure 5L:
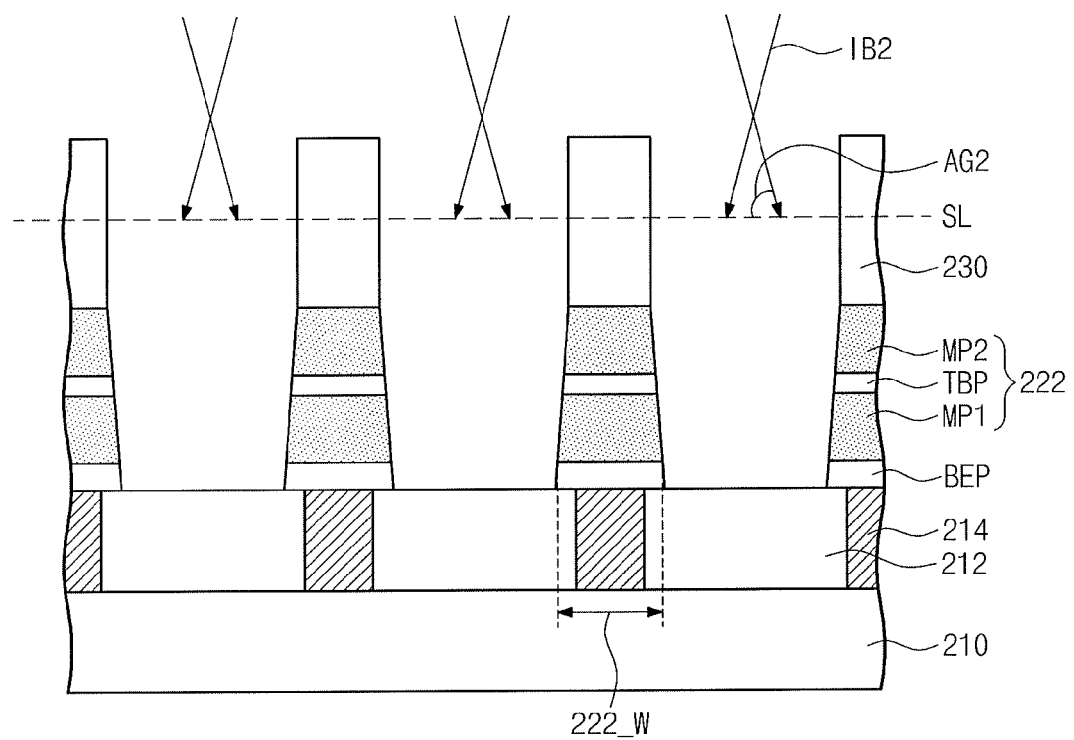

In some embodiments, as illustrated in FIGS. 5K and 5L, the pre-oxidation trim process may be further repeated. FIG. 5K illustrates a cross-sectional view of operation S10 of FIG. 4. FIG. 5L illustrates a cross-sectional view of operation S20 of FIG. 4. The pre-oxidation trim process of FIGS. 5K and 5L may be similar to the pre-oxidation trim process described with reference to FIGS. 5D to 5F. The pre-oxidation trim process of FIGS. 5K and 5L may include performing the oxidation process to form an insulating layer IL (S10) and performing the second sputter etch process to remove at least a portion of the insulating layer IL (S20).

Referring to FIGS. 4 and 5K, the oxidation process may be performed to form an insulating layer IL on the sidewall of each of the magnetic tunnel junction patterns 222 (S10). Forming the insulating layer IL may include oxidizing each of the magnetic tunnel junction patterns 222 by a predetermined depth from the sidewall of each of the magnetic tunnel junction patterns 222, and a width 222_W of each of the magnetic tunnel junction patterns 222 may be reduced. The sidewalls of the bottom electrode patterns BEP and exposed surfaces of the conductive mask patterns 230 may also be oxidized during the oxidation process, and the insulating layer IL may extend onto the sidewall of each of the bottom electrode patterns BEP and the surface of each of the conductive mask patterns 230. A thickness IL_TH of the insulating layer IL may be in a range of about 10 Å to about 100 Å.

Next, referring to FIGS. 4 and 5L, the second sputter etch process may be performed to remove at least a portion of the insulating layer IL (S20). The second ion beam IB2 may be provided to the substrate 210 on which the insulating layer IL is formed. The second ion beam IB2 may have the second incident energy less than the first incident energy. In some embodiments, the second ion beam IB2 may collide with the sidewalls of the magnetic tunnel junction patterns 222. Since the second incident energy may be less than the first incident energy, it may be possible to inhibit generation of the intermixing layer IMX described with reference to FIGS. 5B and 5C.

The second ion beam IB2 may be irradiated to a surface of the insulating layer IL at the second angle AG2 with respect to the reference line SL parallel to the top surface of the substrate 210. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced. In some embodiments, the insulating layer IL may be removed by the second sputter etch process, as illustrated in FIG. 5L.

As described with reference to FIG. 5F, the second etch by-product generated from the insulating layer IL may be re-deposited on the sidewalls of the magnetic tunnel junction patterns 222 during the second sputter etch process. The second etch by-product may be formed of an insulating material.

Figure 5M:
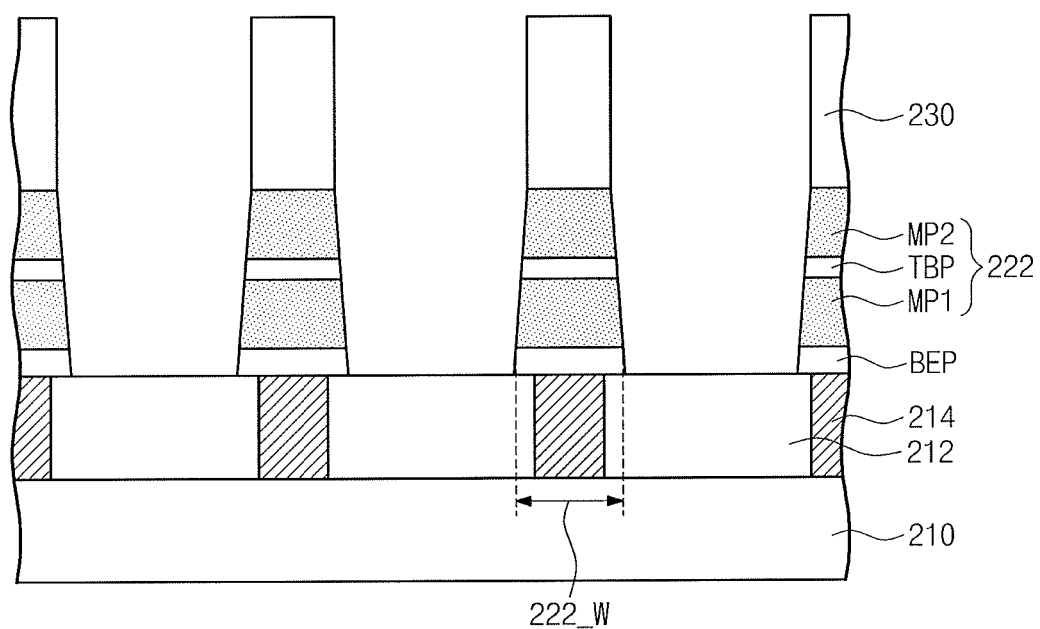
Figure 5N:
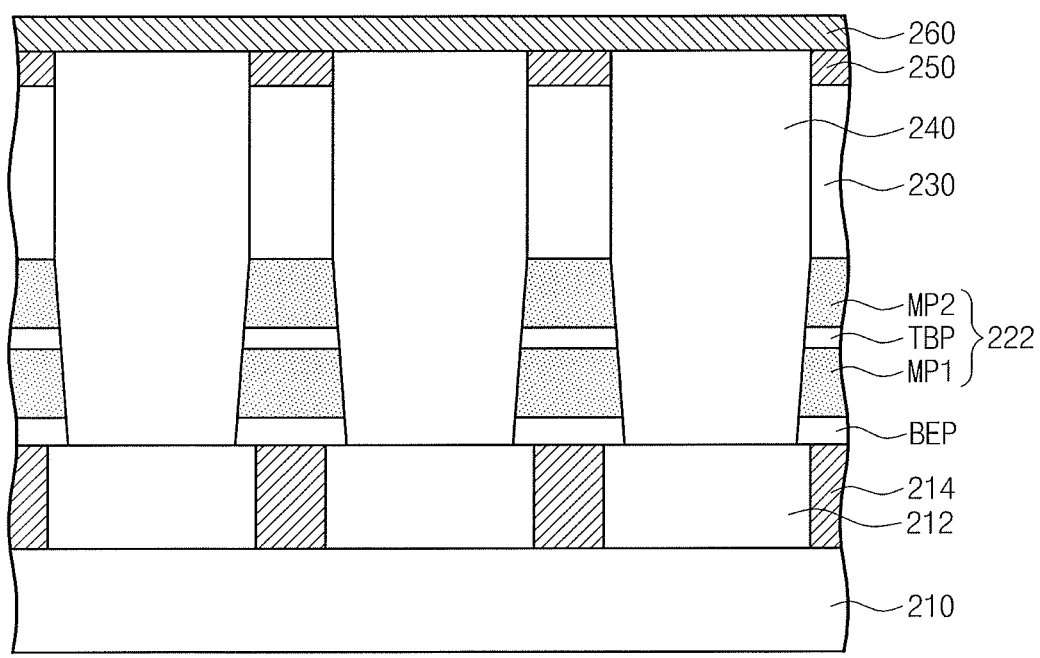

The pre-oxidation trim process described with reference to FIGS. 5K and 5L may be repeatedly performed one or more times. The width 222_W of each of the magnetic tunnel junction patterns 222 may be reduced by each of the pre-oxidation trim processes repeatedly performed, and the width 222_W of each of the magnetic tunnel junction patterns 222 may be further reduced, as illustrated in FIG. 5M. The pre-oxidation trim process of FIGS. 5K and 5L may be repeatedly performed until each of the magnetic tunnel junction patterns 222 has a sufficient small width 222_W.

FIG. 5N illustrates a cross-sectional view of operation S450 of FIG. 4. Referring to FIGS. 4 and 5N, an upper interlayer insulating layer 240 may be formed on the lower interlayer insulating layer 212 (S450). The upper interlayer insulating layer 240 may cover the bottom electrode patterns BEP, the magnetic tunnel junction patterns 222, and the conductive mask patterns 230. The upper interlayer insulating layer 240 may include one or more of silicon oxide, silicon nitride, or silicon oxynitride.

The conductive mask patterns 230 may function as top electrode patterns which are disposed on the magnetic tunnel junction patterns 222, respectively. Upper contact plugs 250 may be formed to penetrate the upper interlayer insulating layer 240. The upper contact plugs 250 may be connected to the conductive mask patterns 230, respectively.

An interconnection 260 may be formed on the upper interlayer insulating layer 240. The interconnection 260 may extend in one direction and may be electrically connected to a plurality of magnetic tunnel junction patterns 222 arranged along the one direction. In some embodiments, the interconnection 260 may function as a bit line.

Figure 6A:
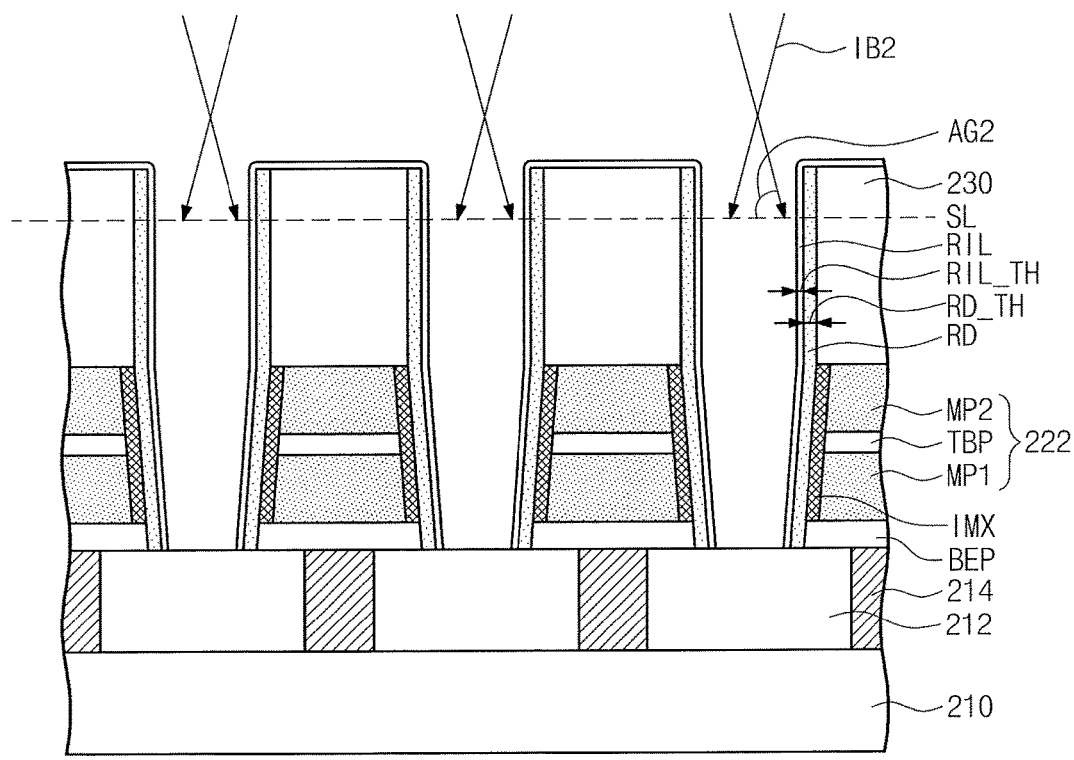
FIGS. 6A to 6C illustrate cross-sectional views of operation S350 of FIG. 1 according to some embodiments.
Figure 6B:
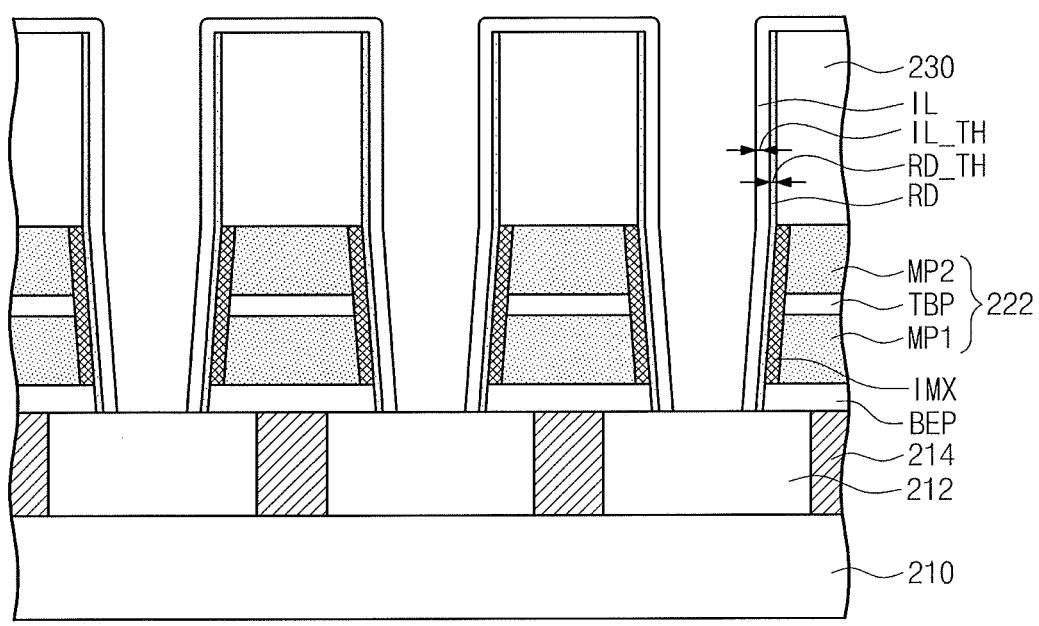
Figure 6C:
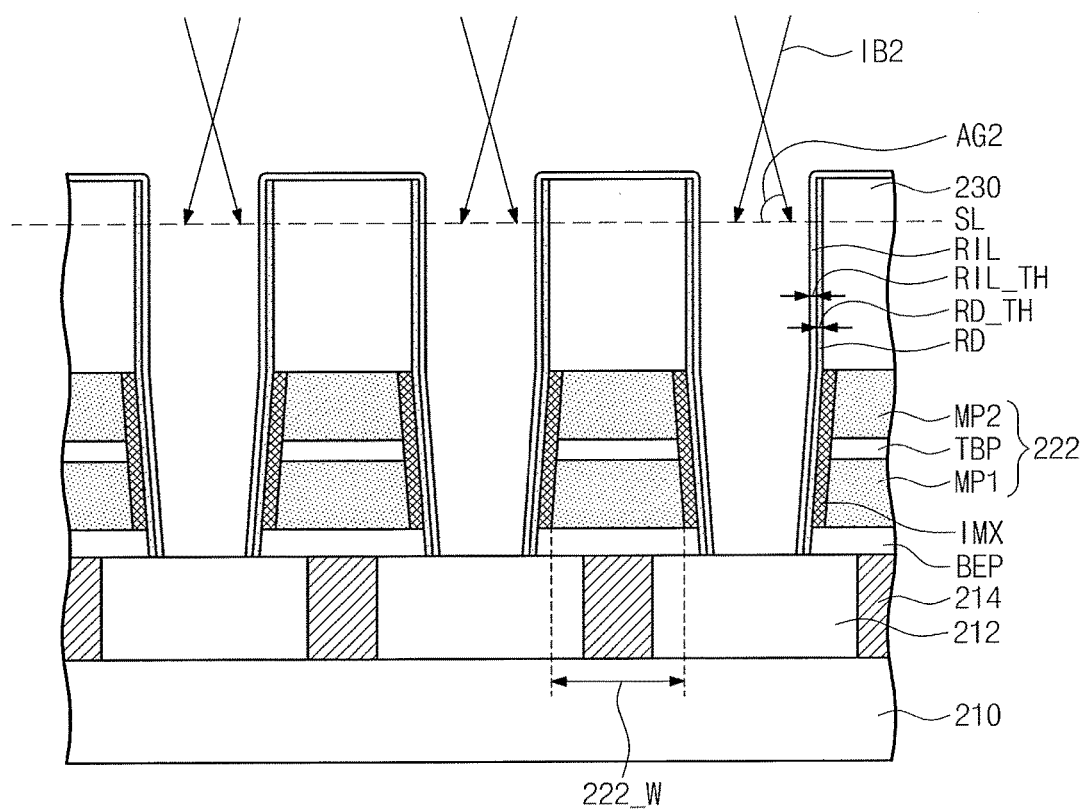

FIGS. 6A to 6C illustrate cross-sectional views of operation S350 of FIG. 1 according to some embodiments. FIG. 6A illustrates a cross-sectional view of operation S20 of FIG. 4.

Referring to FIGS. 4 and 6A, the second sputter etch process may be performed on the structure described with reference to FIG. 5D to remove a portion of the insulating layer IL (S20). The second ion beam IB2 may be provided to the substrate 210 having the insulating layer IL. The second ion beam IB2 may have the second incident energy less than the first incident energy.

The second ion beam IB2 may be irradiated to the surface of the insulating layer IL at the second angle AG2 with respect to the reference line SL parallel to the top surface of the substrate 210. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced.

According to the embodiment described with reference to FIG. 6A, only a portion of the insulating layer IL may be etched by the second sputter etch process but the other portion RIL of the insulating layer IL may remain after the second sputter etch process. A thickness RIL_TH of the remaining insulating layer RIL may be smaller than the thickness IL_TH of the insulating layer IL of FIG. 5D before the second sputter etch process. The remaining insulating layer RIL may cover the sidewall of each of the magnetic tunnel junction patterns 222. The remaining insulating layer RIL may extend to cover the bottom electrode pattern BEP and the conductive mask pattern 230. As illustrated in FIG. 6A, in the case in which the re-deposited layer RD exists, the remaining insulating layer RIL may cover the re-deposited layer RD. The bottom electrode patterns BEP, the magnetic tunnel junction patterns 222, the conductive mask patterns 230, and/or the re-deposited layer RD may be covered with the remaining insulating layer RIL and may not be exposed.

As described with reference to FIG. 5F, the second etch by-product generated from the insulating layer IL may be re-deposited on the sidewall of each of the magnetic tunnel junction patterns 222 during the second sputter etch process. The second etch by-product may include an insulating material.

FIG. 6B illustrates a cross-sectional view of operation S10 of FIG. 4. FIG. 6C illustrates a cross-sectional view of operation S20 of FIG. 1. Referring to FIGS. 4, 6B, and 6C, the pre-oxidation trim process may be repeatedly performed (S350). The repeated pre-oxidation trim process may be similar to the pre-oxidation trim process described with reference to FIGS. 4, 5D, and 6A.

Referring to FIGS. 4 and 6B, the oxidation process may be performed to form an insulating layer IL on the sidewall of each of the magnetic tunnel junction patterns 222 (S10). The formation of the insulating layer IL may include oxidizing at least a portion of the re-deposited layer RD, and the thickness RD_TH of the re-deposited layer RD may be further reduced. The sidewalls of the bottom electrode pattern BEP and exposed surfaces of the conductive mask patterns 230 may also be oxidized during the oxidation process, and the insulating layer IL may extend onto the sidewall of each of the bottom electrode patterns BEP and the surface of each of the conductive mask patterns 230. The remaining insulating layer RIL of FIG. 6A may be included in the insulating layer IL of FIG. 6B. A thickness IL_TH of the insulating layer IL may range from about 10 Å to about 100 Å.

Next, referring to FIGS. 4 and 6C, the second sputter etch process may be performed to remove a portion of the insulating layer IL (S20). The second ion beam IB2 may be provided to the substrate 210 having the insulating layer IL. The second ion beam IB2 may have the second incident energy less than the first incident energy.

The second ion beam IB2 may be irradiated to a surface of the insulating layer IL at the second angle AG2 with respect to the reference line SL parallel to the top surface of the substrate 210. In some embodiments, the second angle AG2 may be smaller than the first angle AG1. For example, the second angle AG2 may range from 30 degrees to 60 degrees. The insulating layer IL may be etched by the second ion beam IB2, and the thickness IL_TH of the insulating layer IL may be reduced.

According to the embodiment described with reference to FIG. 6C, only a portion of the insulating layer IL may be etched by the second sputter etch process but the other portion RIL, of the insulating layer IL may remain after the second sputter etch process. A thickness RIL_TH of the remaining insulating layer RIL may be smaller than the thickness IL_TH of the insulating layer IL of FIG. 6B before the second sputter etch process. The remaining insulating layer RIL may cover the sidewall of each of the magnetic tunnel junction patterns 222. The remaining insulating layer RIL may extend to cover the sidewall of the bottom electrode patterns BEP and the surface of each of the conductive mask patterns 230. As illustrated in FIG. 6C, in the case in which the re-deposited layer RD exists, the remaining insulating layer RIL may cover the re-deposited layer RD. The bottom electrode patterns BEP, the magnetic tunnel junction patterns 222, the conductive mask patterns 230, and/or the re-deposited layer RD may be covered with the remaining insulating layer RIL and may not be exposed.

As described with reference to FIG. 5F, the second etch by-product generated from the insulating layer IL may be re-deposited on the sidewalls of the magnetic tunnel junction patterns 222 during the second sputter etch process. The second etch by-product may include an insulating material.

The pre-oxidation trim process described with reference to FIGS. 6B and 6C may be repeatedly performed, and the re-deposited layer RD and the intermixing layer IMX may be removed. The width 222_W of each of the magnetic tunnel junction patterns 222 may be reduced.

The re-deposited layer RD and/or the intermixing layer IMX formed on the sidewall of the magnetic tunnel junction pattern 222 may cause an electrical short between the first magnetic pattern MP1 and the second magnetic pattern MP2. In the method for manufacturing the magnetic memory device according to some embodiments, the pre-oxidation trim process may be repeatedly performed to remove the re-deposited layer RD and/or the intermixing layer IMX, and reliability of the magnetic memory device may be improved.

In the method for manufacturing the magnetic memory device according to some embodiments, the pre-oxidation trim process may be repeatedly performed to reduce the width 222_W of the magnetic tunnel junction pattern 222, and it may be possible to form the magnetic tunnel junction pattern 222 having the width smaller than the minimum width (or the minimum feature size) defined by a photolithography process.

The pre-oxidation trim process may include performing the oxidation process to form the insulating layer IL and performing the second sputter etch process to remove at least a portion of the insulating layer IL, the etch by-product generated in the process of removing the re-deposited layer RD may be formed of an insulating material, and the etch by-product generated during the second sputter etch process may not cause an electrical short between the first magnetic pattern MP1 and the second magnetic pattern MP2.

Figure 7A:
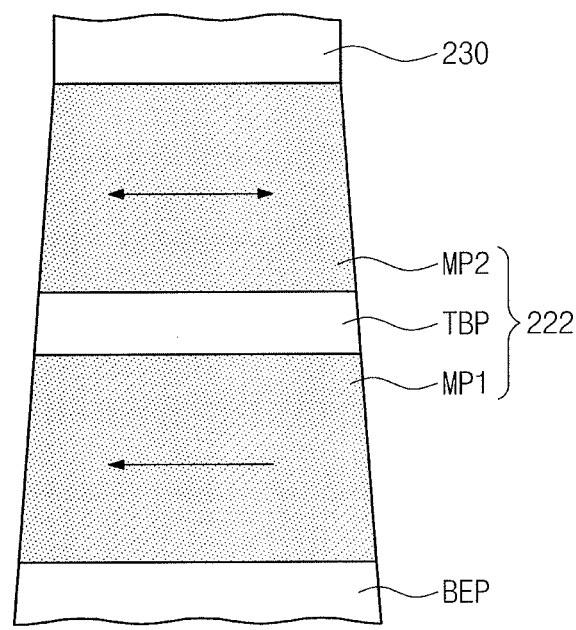
FIGS. 7A and 7B illustrate conceptual views of magnetic tunnel junction patterns according to some embodiments.
Figure 7B:
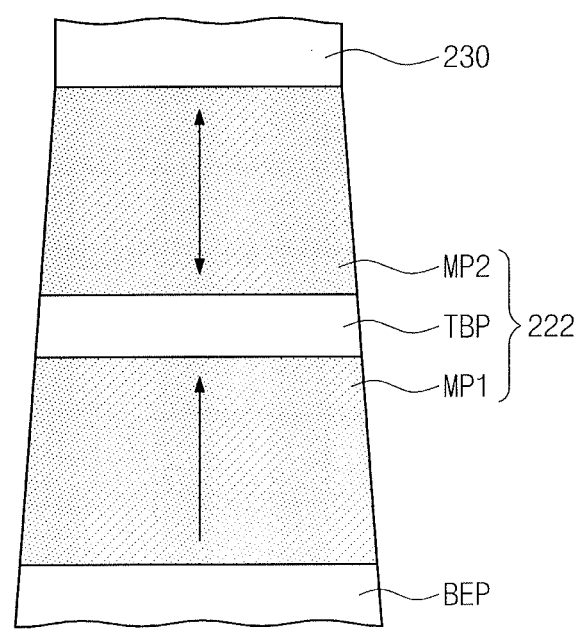

FIGS. 7A and 7B illustrate conceptual views of magnetic tunnel junction patterns according to some embodiments. Each of the magnetic tunnel junction patterns 222 may include the first magnetic pattern MP1, the tunnel barrier pattern TBP, and the second magnetic pattern MP2, as described above. One of the first and second magnetic patterns MP1 and MP2 may be a free pattern of a magnetic tunnel junction, and the other of the first and second magnetic patterns MP1 and MP2 may be a pinned pattern (or a reference pattern). Hereinafter, the first magnetic pattern MP1 corresponding to the pinned pattern and the second magnetic pattern MP2 corresponding to the free pattern will be described as an example for the purpose of ease and convenience in explanation. In embodiments, the first magnetic pattern MP1 may correspond to the free pattern and the second magnetic pattern MP2 may correspond to the pinned pattern. An electrical resistance of the magnetic tunnel junction pattern 222 may be determined depending on magnetization directions of the free pattern and the pinned pattern. For example, the magnetic tunnel junction pattern 222 may have a first electrical resistance when the magnetization directions of the free pattern and the pinned pattern are parallel to each other, the magnetic tunnel junction pattern 222 may have a second electrical resistance greater than the first electrical resistance when the magnetization directions of the free pattern and the pinned pattern are anti-parallel to each other. The electrical resistance of the magnetic tunnel junction pattern 222 may be adjusted by changing the magnetization direction of the free pattern, and this may be used as a data storing principle of the magnetic memory device according to some embodiments.

Referring to FIG. 7A, the first magnetic pattern MP1 and the second magnetic pattern MP2 may be magnetic patterns for constituting a horizontal magnetization structure having magnetization directions substantially parallel to a top surface of the tunnel barrier pattern TBP. In these embodiments, the first magnetic pattern MP1 may include a layer including an anti-ferromagnetic material and a layer including a ferromagnetic material. The layer including the anti-ferromagnetic material may include one or more of PtMn, IrMn, MnO, MnS, MnTe, $MnF_2$, $FeCl_2$, FeO, $CoCl_2$, CoO, $NiCl_2$, NiO, or Cr. In some embodiments, the layer including the anti-ferromagnetic material may include at least one precious metal. The precious metal may include ruthenium (Ru), rhodium (Rh), palladium (Pd), osmium (Os), iridium (Ir), platinum (Pt), gold (Au), or silver (Ag). The layer including the ferromagnetic material may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a material having a changeable magnetization direction. The second magnetic pattern MP2 may include an ferromagnetic material. For example, the second magnetic pattern MP2 may include one or more of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a plurality of ferromagnetic layers and a non-magnetic layer disposed between the ferromagnetic layers. In this case, the ferromagnetic layers and the non-magnetic layer may constitute a synthetic anti-ferromagnetic layer. The synthetic anti-ferromagnetic layer may reduce a critical current density of the magnetic memory device and may improve thermal stability of the magnetic memory device.

The tunnel barrier pattern TBP may include one or more of magnesium oxide (MgO), titanium oxide (TiO), aluminum oxide (AlO), magnesium-zinc oxide (MgZnO), magnesium-boron oxide (MgBO), titanium nitride (TiN), or vanadium nitride. In some embodiments, the tunnel barrier pattern TBP a single magnesium oxide layer. In some embodiments, the tunnel barrier pattern TBP may include a plurality of layers. The tunnel barrier pattern TBP may be formed using a chemical vapor deposition (CVD) process.

Referring to FIG. 7B, the first magnetic pattern MP1 and the second magnetic pattern MP2 may have a perpendicular magnetization structure in which magnetization directions are substantially perpendicular to the top surface of the tunnel barrier pattern TBP. In these embodiments, each of the first and second magnetic patterns MP1 and MP2 may include one or more of a material having a $L1_0$ crystal structure, a material having a hexagonal close packed (HCP) crystal structure, or an amorphous rare-earth transition metal (RE-TM) alloy. In some embodiments, each of the first and second magnetic patterns MP1 and MP2 may include at least one selected from the materials having the $L1_0$ crystal structure which include $Fe_{50}Pt_{50}$, $Fe_{50}Pd_{50}$, $Co_{50}Pt_{50}$, $Co_{50}Pd_{50}$, and $Fe_{50}Ni_{50}$. In some embodiments, each of the first and second magnetic patterns MP1 and MP2 may include a CoPt disordered alloy or $Co_3Pt$ ordered alloy that has the HCP crystal structure and a platinum content of 10 at % to 45 at %. In some embodiments, each of the first and second magnetic patterns MP1 and MP2 may include the amorphous RE-TM alloy that includes at least one rare-earth metal (e.g., terbium (Tb), dysprosium (Dy), and/or gadolinium (Gd)) and one or more of iron (Fe), cobalt (Co), or nickel (Ni).

The first and second magnetic patterns MP1 and MP2 may include a material having interface perpendicular magnetic anisotropy. The interface perpendicular magnetic anisotropy may mean that a magnetization direction of a magnetic layer having an intrinsic horizontal magnetization property is changed into a perpendicular magnetization direction by an influence of an interface between the magnetic layer and another layer adjacent thereto. The intrinsic horizontal magnetization property may mean that a magnetic layer has a magnetization direction parallel to the widest surface of the magnetic layer when an external factor does not exist. For example, when the magnetic layer having the intrinsic horizontal magnetization property is formed on a substrate and an external factor does not exist, the magnetization direction of the magnetic layer may be substantially parallel to a top surface of the substrate.

For example, the first and second magnetic patterns MP1 and MP2 may include one or more of cobalt (Co), iron (Fe), or nickel (Ni). The first and second magnetic patterns MP1 and MP2 may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, the first and second magnetic patterns MP2 may include CoFe or NiFe and may further include boron (B). To reduce saturation magnetization of the first and second magnetic patterns MP1 and MP2, the first and second magnetic patterns MP1 and MP2 may further include one or more of titanium (Ti), aluminum (Al), silicon (Si), magnesium (Mg), or tantalum (Ta). The first and second magnetic patterns MP1 and MP2 may be formed using a sputtering process or a CVD process.

The magnetic tunnel junction layer 220 described with reference to FIG. 5A may include the substantially same material as the magnetic tunnel junction pattern 222.

By way of summation and review, magnetic memory devices may use a magnetic tunnel junction (MTJ). The MTJ may include two magnetic layers and an insulating layer disposed between the two magnetic layers. A resistance of the MTJ may be changed depending on magnetization directions of the two magnetic layers. For example, when the magnetization directions of the two magnetic layers are anti-parallel to each other, the MTJ may have a relatively high resistance. On the contrary, when the magnetization directions of the two magnetic layers are parallel to each other, the MTJ may have a relatively low resistance. Magnetic memory devices may write and/or read logic data by means of a difference between the resistances of the MTJ.

For example, a spin transfer torque-magnetic random access memory (STT-MRAM) device among magnetic memory devices may have a characteristic that a magnitude of a write current is reduced as a size of a magnetic cell is reduced. A STT-MRAM device may be a high-density memory device.

When MTJ patterns are separated from each other by an Ar sputtering etch process, a re-deposition phenomenon may occur on sidewalls of the MTJ patterns by the sputtering process. To remove a re-deposited layer, a trim etch process may be performed at a low angle by means of a low voltage. The low-voltage trim etch process may be performed using a sputtering process, the re-deposition phenomenon may also occur in the low-voltage trim etch process, and even after the trim process is completed, a metal material may not be completely removed from the sidewall of the MTJ pattern. The remaining metal material may cause an electrical short of the MTJ pattern.

According to some embodiments, a metal material remaining after MTJ pattern separation may be oxidized and then a trim process may be performed, and a material re-deposited during the trim etch process may be an oxidized material, not a metal material, and it may be possible to prevent generation of an etch by-product (e.g., a metal material) which may cause an electrical short of the MTJ pattern.

Embodiments may provide a method for forming patterns capable of inhibiting occurrence of a conductive etching by-product. Embodiments may also provide a method for forming patterns with widths smaller than the minimum width defined by a photolithography process. Embodiments may also provide a method for manufacturing a magnetic memory device with excellent reliability.

In the method for manufacturing the magnetic memory device according to some embodiments, the pre-oxidation trim process may be repeatedly performed to remove the re-deposited layer and/or the intermixing layer, and the reliability of the magnetic memory device may be improved.

In the method for manufacturing the magnetic memory device according to some embodiments, the pre-oxidation trim process may be repeatedly performed to reduce the width of each of the magnetic tunnel junction patterns, and it may be possible to form the magnetic tunnel junction pattern having the width smaller than the minimum width defined by a photolithography process.

The pre-oxidation trim process may include performing the oxidation process to form the insulating layer and performing the second sputter etch process to remove at least a portion of the insulating layer, the etch by-product generated in the process of removing the re-deposited layer may be an insulating material, and the etch by-product generated in the second sputter etch process may not cause an electrical short between the magnetic patterns of the magnetic tunnel junction pattern.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for forming a pattern, the method comprising:
    forming an etch target layer on a substrate;
    patterning the etch target layer to form patterns such that a re-deposited layer is formed on a sidewall of each of the patterns thereby; and
    performing a pre-oxidation trim process on the re-deposited layer a plurality of times,
    the pre-oxidation trim process including:
    performing an oxidation process on the re-deposited layer to form an insulating layer on the sidewall of each of the patterns; and
    performing a sputter etch process to remove at least a portion of the insulating layer.

2. The method as claimed in claim 1, wherein the sputter etch process is performed in such a way that a portion of the insulating layer remains.

3. The method as claimed in claim 2, wherein a remaining portion of the insulating layer covers the sidewall of each of the patterns.

4. The method as claimed in claim 1, wherein:
    an etch by-product generated by patterning the etch target layer is re-deposited on the sidewall of each of the patterns to form the re-deposited layer, and
    at least a portion of the re-deposited layer is oxidized to form the insulating layer.

5. The method as claimed in claim 4, wherein at least a portion of the re-deposited layer is removed whenever the pre-oxidation trim process is performed.

6. The method as claimed in claim 5, wherein the pre-oxidation trim process is repeatedly performed until the re-deposited layer is removed.

7. The method as claimed in claim 1, wherein a portion of each of the patterns is oxidized to form the insulating layer.

8. The method as claimed in claim 1, wherein:
    the patterning of the etch target layer includes performing a first sputter etch process irradiating a first ion beam to the substrate, and
    the sputter etch process included in the pre-oxidation trim process is a second sputter etch process irradiating a second ion beam to the substrate.

9. The method as claimed in claim 8, wherein incident energy of the second ion beam is less than incident energy of the first ion beam.

10. The method as claimed in claim 8, wherein an angle between the second ion beam and a top surface of the substrate is smaller than an angle between the first ion beam and the top surface of the substrate.

11. A method for manufacturing a magnetic memory device, the method comprising:
    forming a magnetic tunnel junction layer on a substrate;
    patterning the magnetic tunnel junction layer to form magnetic tunnel junction patterns such that a re-deposited layer is formed on a sidewall of each of the magnetic tunnel junction patterns thereby; and
    performing a pre-oxidation trim process on the re-deposited layer a plurality of times,
    the pre-oxidation trim process including:
    performing an oxidation process on the re-deposited layer to form an insulating layer on a sidewall of each of the magnetic tunnel junction patterns; and
    performing a sputter etch process to remove at least a portion of the insulating layer.

12. The method as claimed in claim 11, wherein:
    an etch by-product generated by patterning the magnetic tunnel junction layer is re-deposited on the sidewall of each of the magnetic tunnel junction patterns to form the re-deposited layer, and
    at least a portion of the re-deposited layer is oxidized to form the insulating layer.

13. The method as claimed in claim 12, wherein:
    at least a portion of the re-deposited layer is removed whenever the pre-oxidation trim process is performed, and
    the pre-oxidation trim process is repeatedly performed until the re-deposited layer is removed.

14. The method as claimed in claim 11, wherein:
    the forming of the magnetic tunnel junction layer includes sequentially depositing a first magnetic layer, a tunnel barrier layer, and a second magnetic layer, an intermixing layer is formed on the sidewall of each of the magnetic tunnel junction patterns by patterning the magnetic tunnel junction layer, the intermixing layer includes materials that are included in the first magnetic layer, the tunnel barrier layer, and the second magnetic layer, respectively, and at least a portion of the intermixing layer is oxidized to form the insulating layer.

15. The method as claimed in claim 14, wherein at least a portion of the intermixing layer is removed by the pre-oxidation trim process.

16. The method as claimed in claim 15, wherein the pre-oxidation trim process is repeatedly performed until the intermixing layer is removed.

17. The method as claimed in claim 11, wherein:
the patterning of the magnetic tunnel junction layer includes irradiating a first ion beam to the substrate,
performing the sputter etch process of the pre-oxidation trim process includes irradiating a second ion beam to the substrate, and
incident energy of the second ion beam is less than incident energy of the first ion beam.

18. A method for manufacturing a device, the method comprising:
separating magnetic tunnel junction patterns from each other such that re-deposited layers are formed on sidewalls of the magnetic tunnel junction patterns;
partially oxidizing the re-deposited layers on the sidewalls of the magnetic tunnel junction patterns after the separating such that the re-deposited layers have oxidized portions and non-oxidized portions; and
trimming the oxidized portions of the re-deposited layers from the sidewalls of the magnetic tunnel junction patterns.

19. The method as claimed in claim 18, wherein:
the separating includes a first sputtering process using argon ions; and
trimming the oxidized portions of the re-deposited layers from the sidewalls of the magnetic tunnel junction patterns includes a second sputtering process including use of argon ions.

20. The method as claimed in claim 18, further comprising oxidizing the non-oxidized portions of the re-deposited layers to form other oxidized portions and then trimming the other oxidized portions of the re-deposited layers from the sidewalls of the magnetic tunnel junction patterns.

* * * * *